(12) United States Patent
Chou et al.

(10) Patent No.: US 12,289,902 B2
(45) Date of Patent: *Apr. 29, 2025

(54) NITRIDE-BASED SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Yi-Lun Chou, Suzhou (CN); Shuang Gao, Suzhou (CN); Chuangang Li, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/623,259

(22) PCT Filed: Nov. 9, 2021

(86) PCT No.: PCT/CN2021/129628
§ 371 (c)(1),
(2) Date: Dec. 28, 2021

(87) PCT Pub. No.: WO2023/082060
PCT Pub. Date: May 19, 2023

(65) Prior Publication Data
US 2024/0038885 A1 Feb. 1, 2024

(51) Int. Cl.
*H10D 30/47* (2025.01)
*H01L 21/02* (2006.01)
(Continued)

(52) U.S. Cl.
CPC ..... *H10D 30/475* (2025.01); *H01L 21/02241* (2013.01); *H01L 21/0254* (2013.01);
(Continued)

(58) Field of Classification Search
None
See application file for complete search history.

(56) References Cited

U.S. PATENT DOCUMENTS

2016/0254377 A1 9/2016 Morancho et al.
2018/0069090 A1 3/2018 Morancho et al.
(Continued)

FOREIGN PATENT DOCUMENTS

CN 1614836 A 5/2005
CN 106887467 A 6/2017
(Continued)

OTHER PUBLICATIONS

International Search Report and Written Opinion of corresponding PCT Patent Application No. PCT/CN2021/129628 mailed on Aug. 4, 2022.
(Continued)

*Primary Examiner* — Jack S Chen
(74) *Attorney, Agent, or Firm* — JCIPRNET

(57) ABSTRACT

A nitride-based semiconductor device includes a first nitride-based semiconductor layer, a single III-V group semiconductor layer, a third nitride-based semiconductor layer, a first source electrode and a second electrode, and a gate electrode. The second nitride-based semiconductor layer is disposed over the first nitride-based semiconductor layer. The single III-V group semiconductor layer is disposed between the first and second nitride-based semiconductor layers and doped to the first conductivity type. The single III-V group semiconductor layer has a high resistivity region and a current aperture enclosed by the high resistivity region, in which the high resistivity region comprises more metal oxides than the current aperture so as to achieve a resistivity higher than that of the current aperture. The third nitride-based semiconductor layer is disposed over the second nitride-based semiconductor layer. The first source
(Continued)

electrode, the second electrode, and the gate electrode are disposed over the third nitride-based semiconductor layer.

15 Claims, 13 Drawing Sheets

(51) Int. Cl.
*H01L 21/306* (2006.01)
*H01L 21/76* (2006.01)
*H10D 30/01* (2025.01)
*H10D 62/10* (2025.01)
*H10D 62/824* (2025.01)
*H10D 62/85* (2025.01)

(52) U.S. Cl.
CPC .... *H01L 21/30612* (2013.01); *H01L 21/7605* (2013.01); *H10D 30/015* (2025.01); *H10D 30/4755* (2025.01); *H10D 30/477* (2025.01); *H10D 62/113* (2025.01); *H10D 62/824* (2025.01); *H10D 62/8503* (2025.01)

(56) References Cited

U.S. PATENT DOCUMENTS

| | | | |
|---|---|---|---|
| 2019/0115459 A1 | 4/2019 | Kim | |
| 2023/0144369 A1* | 5/2023 | Chou | H10D 62/8164 257/76 |
| 2023/0147426 A1* | 5/2023 | Chou | H10D 30/475 257/76 |
| 2023/0261103 A1* | 8/2023 | Chou | H10D 62/8503 257/76 |

FOREIGN PATENT DOCUMENTS

| | | |
|---|---|---|
| CN | 107068740 A | 8/2017 |
| CN | 107146811 A | 9/2017 |
| CN | 110875372 A | 3/2020 |
| CN | 111799162 | 10/2020 |
| CN | 113228297 | 8/2021 |
| CN | 113421914 A | 9/2021 |
| JP | 2008270310 | 11/2008 |
| KR | 20140028424 A | 3/2014 |

OTHER PUBLICATIONS

United States Patent and Trademark Office, Restriction Requirement Issued in U.S. Appl. No. 17/671,555, filed May 2, 2024, 7 pages.
United States Patent and Trademark Office, Restriction Requirement Issued in U.S. Appl. No. 17/671,558, filed May 2, 2024, 7 pages.
United States Patent and Trademark Office, non-final office action issued in U.S. Appl. No. 17/671,562, filed Apr. 25, 2024, 20 pages.

* cited by examiner

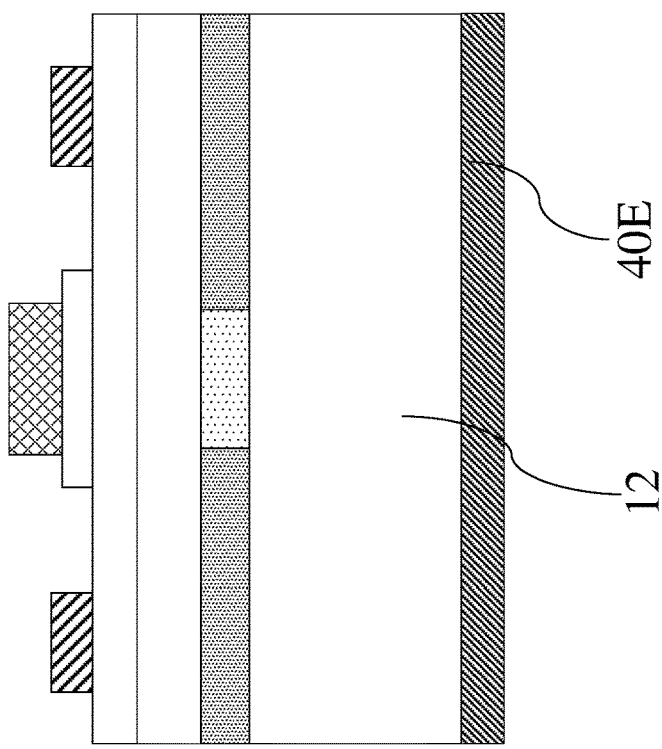
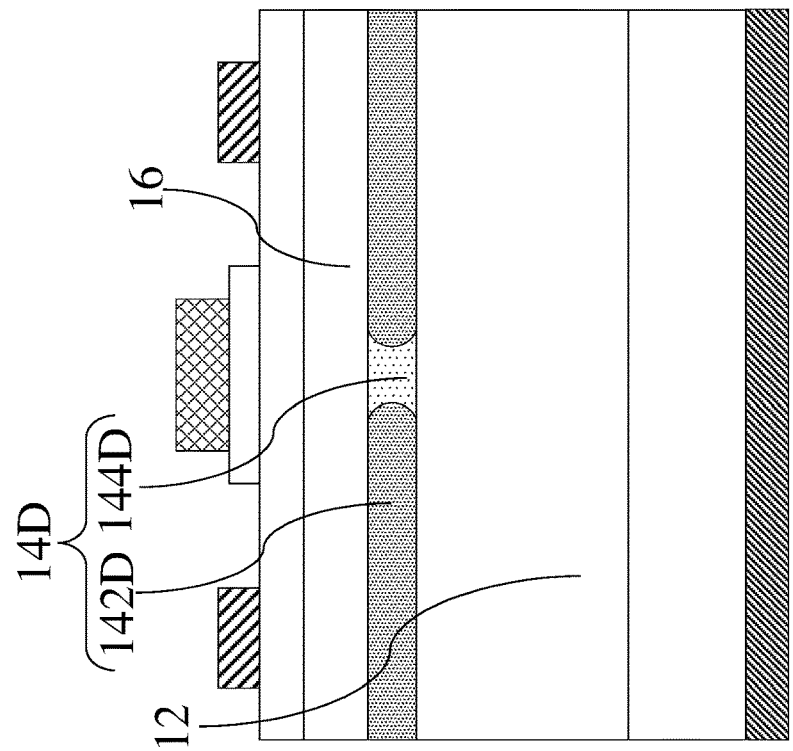

NITRIDE-BASED SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a nitride-based semiconductor device having a current blocking layer.

BACKGROUND OF THE DISCLOSURE

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

SUMMARY OF THE DISCLOSURE

In accordance with one aspect of the present disclosure, a nitride-based semiconductor device is provided. The nitride-based semiconductor device includes a first nitride-based semiconductor layer, a single III-V group semiconductor layer, a third nitride-based semiconductor layer, a first source electrode and a second electrode, and a gate electrode. The first nitride-based semiconductor layer is doped to a first conductivity type. The second nitride-based semiconductor layer is disposed over the first nitride-based semiconductor layer. The single III-V group semiconductor layer is disposed between the first and second nitride-based semiconductor layers and doped to the first conductivity type. The single III-V group semiconductor layer has a high resistivity region and a current aperture enclosed by the high resistivity region, in which the high resistivity region comprises more metal oxides than the current aperture so as to achieve a resistivity higher than that of the current aperture. The third nitride-based semiconductor layer is disposed over the second nitride-based semiconductor layer. The first source electrode and the second electrode are disposed over the third nitride-based semiconductor layer. The gate electrode is disposed over the third nitride-based semiconductor layer and between the first and second source electrodes, in which the gate electrode aligns with the current aperture.

In accordance with one aspect of the present disclosure, a method for manufacturing a semiconductor device is provided. The method includes steps as follows. A first nitride-based semiconductor layer is formed. A single III-V group semiconductor layer is formed over the first nitride-based semiconductor layer. A second nitride-based semiconductor layer is formed over the first nitride-based semiconductor layer. A third nitride-based semiconductor layer is formed over the second nitride-based semiconductor layer. An etching process is performed to define a device boundary. An oxidizing process is performed to laterally oxidize the single III-V group semiconductor layer. A gate electrode is formed over the third nitride-based semiconductor layer.

In accordance with one aspect of the present disclosure, a nitride-based semiconductor device is provided. The nitride-based semiconductor device includes a first nitride-based semiconductor layer, a lattice layer, a third nitride-based semiconductor layer, a first source electrode and a second electrode, and a gate electrode. The first nitride-based semiconductor layer is doped to a first conductivity type. The second nitride-based semiconductor layer is disposed over the first nitride-based semiconductor layer. The lattice layer is disposed between the first and second nitride-based semiconductor layers and doped to the first conductivity type. The lattice layer comprises a plurality of first III-V layers and a plurality of second III-V layers alternatively stacked. Each of the first III-V layers has a high resistivity region and a current aperture enclosed by the high resistivity region. The high resistivity region comprises more metal oxides than the current aperture so as to achieve a resistivity higher than that of the current aperture. Interfaces formed between the high resistivity regions and the current apertures among the first III-V layers align with each other. The third nitride-based semiconductor layer is disposed over the second nitride-based semiconductor layer. The first source electrode and the second electrode are disposed over the third nitride-based semiconductor layer. The gate electrode is disposed over the third nitride-based semiconductor layer and between the first and second source electrodes, in which the gate electrode aligns with the current aperture.

In accordance with one aspect of the present disclosure, a method for manufacturing a semiconductor device is provided. The method includes steps as follows. A first nitride-based semiconductor layer is formed. A lattice layer is formed over the first nitride-based semiconductor layer, in which the lattice layer comprises a plurality of first III-V layers and a plurality of second III-V layers alternatively stacked. A second nitride-based semiconductor layer is formed over the first nitride-based semiconductor layer. A third nitride-based semiconductor layer is formed over the second nitride-based semiconductor layer. An etching process is performed to define a device boundary. An oxidizing process is performed to laterally oxidize the first III-V layers of the lattice layer. A gate electrode is formed over the third nitride-based semiconductor layer.

In accordance with one aspect of the present disclosure, a nitride-based semiconductor device is provided. The nitride-based semiconductor device includes a first nitride-based semiconductor layer, a lattice layer, a third nitride-based semiconductor layer, a first source electrode and a second electrode, and a gate electrode. The first nitride-based semiconductor layer is doped to a first conductivity type. The second nitride-based semiconductor layer is disposed over the first nitride-based semiconductor layer. The lattice layer is disposed between the first and second nitride-based semiconductor layers and doped to the first conductivity type. The lattice layer comprises a plurality of first III-V layers and a plurality of second III-V layers alternatively stacked. Each of the first III-V layers has a high resistivity region and a current aperture enclosed by the high resistivity region. The high resistivity region comprises more metal oxides than the current aperture so as to achieve a resistivity higher than that of the current aperture. At least two of the current apertures have different dimensions such that at least two of interfaces formed between the high resistivity regions and the current apertures misalign with each other. The third nitride-based semiconductor layer is disposed over the second nitride-based semiconductor layer. The first source electrode and the second electrode are disposed over the third nitride-based semiconductor layer. The gate electrode is disposed over the third nitride-based semiconductor layer and between the first and second source electrodes, in which the gate electrode aligns with the current aperture.

In accordance with one aspect of the present disclosure, a method for manufacturing a semiconductor device is provided. The method includes steps as follows. A first nitride-based semiconductor layer is formed. A lattice layer is formed over the first nitride-based semiconductor layer, in which the lattice layer comprises a plurality of first III-V layers and a plurality of second III-V layers alternatively stacked. A second nitride-based semiconductor layer is formed over the first nitride-based semiconductor layer. A third nitride-based semiconductor layer is formed over the second nitride-based semiconductor layer. An etching process is performed to define a device boundary. An oxidizing process is performed to laterally oxidize the first III-V layers of the lattice layer, in which a first group of the first III-V layers and a second group of the first III-V layers have oxidization region with different lateral dimensions. A gate electrode is formed over the third nitride-based semiconductor layer.

In accordance with one aspect of the present disclosure, a nitride-based semiconductor device is provided. The nitride-based semiconductor device includes a first nitride-based semiconductor layer, a lattice layer, a third nitride-based semiconductor layer, a first source electrode and a second electrode, and a gate electrode. The first nitride-based semiconductor layer is doped to a first conductivity type. The second nitride-based semiconductor layer is disposed over the first nitride-based semiconductor layer. The lattice layer is disposed between the first and second nitride-based semiconductor layers and doped to the first conductivity type. The lattice layer comprises a plurality of first III-V layers and a plurality of second III-V layers alternatively stacked. Each of the first III-V layers has a high resistivity region and a current aperture enclosed by the high resistivity region. The high resistivity region comprises more metal oxides than the current aperture so as to achieve a resistivity higher than that of the current aperture. At least two of the first III-V layers have the same group III element at different concentrations. The third nitride-based semiconductor layer is disposed over the second nitride-based semiconductor layer. The first source electrode and the second electrode are disposed over the third nitride-based semiconductor layer. The gate electrode is disposed over the third nitride-based semiconductor layer and between the first and second source electrodes, in which the gate electrode aligns with the current aperture.

With such configuration, a semiconductor device with a vertical structure can have a current blocking layer. The current blocking layer can be formed by introducing oxygen atoms in to a III-V semiconductor layer, so the formation of a current aperture can be free from an etching process, thereby improving the yield rate. By such the manner, the profile of the current blocking layer can be turned easily, which will be advantageous to comply with different device designs.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIG. 5 is a vertical cross-sectional view of a semiconductor device according to some embodiments of the present disclosure;

FIG. 6 is a vertical cross-sectional view of a semiconductor device according to some embodiments of the present disclosure;

DETAILED DESCRIPTION

Figure 1:
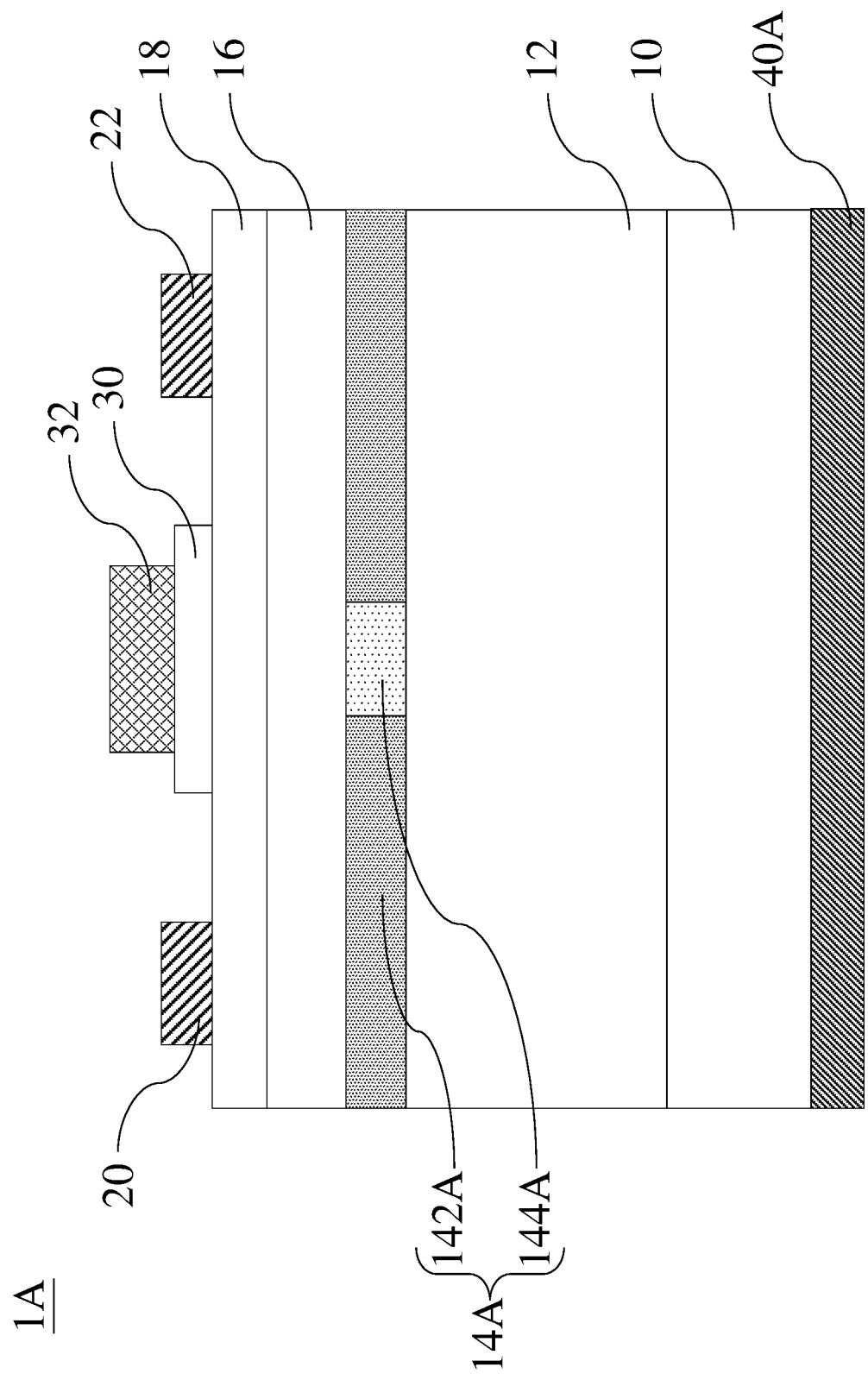
FIG. 1 is a vertical cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

In the present disclosure, a doping region can have a conductive type expressed as a doping type. For example, a doping type maybe n-type or p-type. The term "n-type" may include a plus/minus sign. For example, with respect to n-type dopant, there are three conductive types, including "n$^+$", "n$^-$", and "n". An n$^+$ doping region has a doping concentration higher/heavier than an n-doping region; and an n-doping region has a doping concentration than higher an n$^-$-doping region. Doping regions of the same symbol may have different absolute doping concentrations. For example, two different n doping regions may have the same or different absolute doping concentrations. The definition can be applied to the p-type doping.

In some embodiments, the n-type dopant can include, but are not limited to, silicon (Si), carbon (C), germanium (Ge), Selenium (Se), tellurium (Te), or the like. In some embodiments, the p-type dopant can include, but are not limited to, magnesium (Mg), beryllium (Be), zinc (Zn), or the like. In the exemplary illustrations of the present disclosure, although the element is illustrated as a single layer, it can include multiple layers therein.

In the present disclosure, the used terms "lattice layer" can include a superlattice layer. A superlattice layer can be formed by stacking different kinds of epitaxial growth layers. The number of the layers in a single superlattice layer is more than one. In the present disclosure, illustration for a lattice layer is exemplary. That is, although more than one layer is illustrated to express a lattice layer, it is available that much more layers disposed in a single lattice layer.

FIG. 1 is a vertical cross-sectional view of a semiconductor device 1A according to some embodiments of the present disclosure. The semiconductor device 1A includes a substrate 10, a nitride-based semiconductor layer 12, a single III-V group semiconductor layer 14A, nitride-based semiconductor layers 16 and 18, source electrodes 20 and 22, a doped nitride-based semiconductor layer 30, a gate electrode 32, and a drain electrode 40.

The substrate 10 can be a nitride-based semiconductor layer doped to have a first conductivity type. In some embodiments, the substrate 10 is doped to have an n conductivity type. The exemplary materials of the substrate 10 can include, for example but are not limited to, nitrides or group III-V compounds, such as GaN, AN, InN, $In_xAl_yGa_{(1-x-y)}N$ where $x+y \leq 1$, $Al_yGa_{(1-y)}N$ where $y \leq 1$. For example, the substrate 10 can be a n-type GaN substrate.

The nitride-based semiconductor layer 12 is disposed on/over the substrate 10. The nitride-based semiconductor layer 12 can include a drift region. The drift region can allow current to vertically flow through the nitride-based semiconductor layer 12. For example, at least one current can flow from a top to a bottom of the nitride-based semiconductor layer 12 through the drift region. The nitride-based semiconductor layer 12 can be doped to have the first conductivity type. In some embodiments, the nitride-based semiconductor layer 12 is doped to have an n conductivity type. The exemplary materials of the nitride-based semiconductor layer 12 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$. For example, the nitride-based semiconductor layer 12 can be a n-type GaN layer.

The single III-V group semiconductor layer 14A is disposed on/over the nitride-based semiconductor layer 12. The single III-V group semiconductor layer 14A can be doped to have the first conductivity type. In some embodiments, the single III-V group semiconductor layer 14A is doped to have an n conductivity type. The exemplary materials of the single III-V group semiconductor layer 14A can include, for example but are not limited to, nitrides or group III-V compounds, such as GaN, AlN, InN, $In_xAl_yGa_{(1-x-y)}N$ where $x+y \leq 1$, $In_xAl_{(1-x)}N$ where $x \leq 1$, $Al_yGa_{(1-y)}N$ where $y \leq 1$. For example, the single III-V group semiconductor layer 14A can include n-type InAlN.

The single III-V group semiconductor layer 14A has a high resistivity region 142A and a current aperture 144A. The current aperture 144A is enclosed by the high resistivity region 142A. Herein, the term "high resistivity region" means a resistivity of the high resistivity region 142A is higher than a resistivity of the current aperture 144A. The resistivity difference between the high resistivity region 142A and the current aperture 144A can be achieved by making the high resistivity region 142A comprise more metal oxides than the current aperture 144A.

In some embodiments, the single III-V group semiconductor layer 14A has a group III element in the current aperture 144A and has an oxide of the group III element in the high resistivity region 142A. For example, as the current aperture 144A includes InAlN, the high resistivity region 142A can further include aluminum oxide, such as $Al_2O_3$. The aluminum oxide of the high resistivity region 142A can be formed from InAlN by performing an oxidation process. In some embodiments, prior to the formation of the high resistivity region 142A, an entirety of the single III-V group semiconductor layer 14A can be a layer comprising III-V ternary compound, such as InAlN.

During performing an oxidation process, oxygen atoms are introduced into some portions of the single III-V group semiconductor layer 14A so product of the chemical reaction of the oxidation process will include aluminium oxide. These oxidized portions of the single III-V group semiconductor layer 14A collectively serve as the high resistivity region 142A. The remaining portion of the single III-V group semiconductor layer 14A which is free from the oxidizing serve as the current aperture 144A. By the option to the materials of the single III-V group semiconductor layer 14A, the formation of the high resistivity region 142A can be promoted, and the distinguish interface between the high resistivity region 142A and the current aperture 144A can be formed as well.

In some embodiments, a concentration of the group III element (e.g., Al) in the current aperture 144A can be laterally homogeneous. In some embodiments, a concentration of the group III element (e.g., Al) in the current aperture 144A can be longitudinally homogeneous. In some embodiments, due to the homogeneousness of the concentration, the distinguish interface between the high resistivity region 142A and the current aperture 144A can expand along a substantially vertical plane.

The single III-V group semiconductor layer 14A can allow current to vertically flow therethrough. Since the resistivity of the high resistivity region 142A is higher than the resistivity of the current aperture 144A, the vertically-flowing current will pass through the single III-V group semiconductor layer 14A via the current aperture 144A.

The nitride-based semiconductor layer 16 can be disposed on/over/above the nitride-based semiconductor layer 12 and the single III-V group semiconductor layer 14A. The single III-V group semiconductor layer 14A is present between the nitride-based semiconductor layers 12 and 16. The single III-V group semiconductor layer 14A is in contact with the nitride-based semiconductor layers 12 and 16. The bottom border of the current aperture 144A of the single III-V group semiconductor layer 14A is in contact with the nitride-based semiconductor layer 12. The top border of the current aperture 144A of the single III-V group semiconductor layer 14A is in contact with the nitride-based semiconductor layer 16. The nitride-based semiconductor layer 18 can be disposed on/over/above the nitride-based semiconductor layer 16.

The exemplary materials of the nitride-based semiconductor layer 16 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$. The exemplary materials of the nitride-based semiconductor layer 18 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$.

The exemplary materials of the nitride-based semiconductor layers 16 and 18 are selected such that the nitride-based semiconductor layer 18 has a bandgap (i.e., forbidden band width) greater/higher than a bandgap of the nitride-based semiconductor layer 16, which causes electron affinities thereof different from each other and forms a heterojunction therebetween. For example, when the nitride-based semiconductor layer 16 is an undoped GaN layer having a bandgap of approximately 3.4 eV, the nitride-based semiconductor layer 18 can be selected as an AlGaN layer having bandgap of approximately 4.0 eV. As such, the nitride-based semiconductor layers 16 and 18 can serve as a channel layer and a barrier layer, respectively. A triangular well potential is generated at a bonded interface between the channel and barrier layers, so that electrons accumulate in the triangular well, thereby generating a two-dimensional electron gas (2DEG) region adjacent to the heterojunction. Accordingly, the semiconductor device 1A is available to include at least one GaN-based high-electron-mobility transistor (HEMT).

In some embodiments, the nitride-based semiconductor layer 12 is a n-type GaN layer; the single III-V group semiconductor layer 14A includes n-type InAlN; the nitride-based semiconductor layer 16 is an undoped GaN layer; and the nitride-based semiconductor layer 18 is an undoped AlGaN layer. In such the embodiments, the nitride-based semiconductor layers 12 and 16 in contact with the single III-V group semiconductor layer 14A are devoid of aluminum.

The source electrodes 20 and 22 are disposed on/over/above the nitride-based semiconductor layer 18. The source electrodes 20 and 22 are in contact with the nitride-based semiconductor layer 18. The source electrodes 20 and 22 are directly above the high resistivity region 142 of the single III-V group semiconductor layer 14. The source electrodes 20 and 22 can misalign with the current aperture 144 of the single III-V group semiconductor layer 14.

In some embodiments, the source electrodes 20 and 22 can include, for example but are not limited to, metals, alloys, doped semiconductor materials (such as doped crystalline silicon), compounds such as silicides and nitrides, other conductor materials, or combinations thereof. The exemplary materials of the source electrodes 20 and 22 can include, for example but are not limited to, Ti, AlSi, TiN, or combinations thereof. The source electrodes 20 and 22 may be a single layer, or plural layers of the same or different composition. In some embodiments, the source electrodes and 22 form ohmic contacts with the nitride-based semiconductor layer 16. The ohmic contacts can be achieved by applying Ti, Al, or other suitable materials to the source electrodes 20 and 22. In some embodiments, each of the source electrodes 20 and 22 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The drain electrode 40A is disposed on the substrate 10. The drain electrode 40A is connected to substrate 10. The drain electrode 40A can make contact with the substrate 10. The nitride-based semiconductor layer 12 is located between the drain electrode 40A and the nitride-based semiconductor layer 16. The nitride-based semiconductor layers 12, 16, 18, and the single III-V group semiconductor layer 14A are between the drain electrode 40A and each of the source electrodes 20 and 22. The drain electrode 40A can be electrically coupled with the current aperture 144A, which meaning a current downward flowing through the current aperture 144A can be directed to the drain electrode 40A. The materials of the drain electrode 40A can be identical with or similar with those of the source electrodes 20 and 22.

The doped nitride-based semiconductor layer 30 can be disposed on/over/above the nitride-based semiconductor layer 18. The doped nitride-based semiconductor layer 30 can be in contact with the nitride-based semiconductor layer 18. The doped nitride-based semiconductor layer 30 is located between the source electrodes 20 and 22.

The width of the doped nitride-based semiconductor layer 30 can be greater than the width of the high resistivity region 142A of the single III-V group semiconductor layer 14A. In other embodiments, the width of the doped nitride-based semiconductor layer 30 is less than the width of the high resistivity region 142A of the single III-V group semiconductor layer 14A.

The doped nitride-based semiconductor layer 30 is doped to have a second conductivity type. In some embodiments, the doped nitride-based semiconductor layer 30 is doped to have a p conductivity type.

The doped nitride-based semiconductor layer 30 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Zn, Cd, and Mg. In some embodiments, the doped nitride-based semiconductor layer 30 is a p-type GaN layer which can bend the underlying band structure upwards and to deplete or partially deplete the corresponding zone of the 2DEG region, so as to place the semiconductor device 1A into an off-state condition.

The gate electrode 32 can be disposed on/over/above the nitride-based semiconductor layer 18 and the doped nitride-based semiconductor layer 30. The doped nitride-based semiconductor layer 30 is located between the nitride-based semiconductor layer 18 and the gate electrode 32. The gate electrode 32 is in contact with the doped nitride-based semiconductor layer 30. The gate electrode 32 is present between the source electrodes 20 and 22.

The width of the gate electrode 32 can be greater than the width of the high resistivity region 142A of the single III-V group semiconductor layer 14A. In other embodiments, the width of the gate electrode 32 is less than the width of the high resistivity region 142A of the single III-V group semiconductor layer 14A.

The exemplary materials of the gate electrode 32 may include metals or metal compounds. The gate electrode 32 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds.

The doped nitride-based semiconductor layer 30 and the gate electrode 32 align with the high resistivity region 142A of the single III-V group semiconductor layer 14A. A vertical projection of the doped nitride-based semiconductor layer 30 on the single III-V group semiconductor layer 14A can overlap with the high resistivity region 142A. A vertical projection of the doped nitride-based semiconductor layer 30 on the gate electrode 32 can overlap with the high resistivity region 142A.

By such the configuration, the semiconductor device 1A can have an enhancement mode device, which is in a normally-off state when the gate electrode 32 is at approximately zero bias. Specifically, the doped nitride-based semiconductor layer 30 may create at least one p-n junction with the nitride-based semiconductor layer 16 to deplete or partially deplete the 2DEG region, such that at least one zone of the 2DEG region corresponding to a position below the corresponding the doped nitride-based semiconductor layer 30 has different characteristics (e.g., different electron concentrations) than the remaining of the 2DEG region and thus is blocked.

As a voltage applied to the gate electrode 32 reaches or is over a threshold voltage, the 2DEG region can be turned on (i.e., which allows the flow of carriers to pass through), and thus the semiconductor device 1A is at a switch-on state. At the switch-on state, at least one current can enter the structure of the semiconductor device 1A via the source electrodes 20 and 22. The current can flow along a path which is defined by the single III-V group semiconductor layer 14A. That is, the current can flow to the current aperture 144A of the single III-V group semiconductor layer 14A from the source electrodes 20 and 22 and then pass through the current aperture 144. After the current passes through the current aperture 144A of the single III-V group semiconductor layer 14A, the current flows to the drain electrode 40a.

In the present embodiment, the path for the current can be defined by the single III-V group semiconductor layer 14A which is a layer horizontally expanding in the structure. Herein, the phrase "a layer horizontally expanding in the structure" means the single III-V group semiconductor layer 14A which is configured to serve a current block layer is free from a recess structure. In this regard, to achieve current block feature, practically, other manners for forming a current aperture may be used. One way to achieve a current aperture is to form a recess structure in a current block layer so the current aperture will be filed with other layers. With respect to such the recess structure, there is a need to perform a destructive step, such as an etching step. However, the etching step may result in surface states, so it will reduce the performance of the semiconductor device. Also, the process variation in the etching step may cause the lower yield rate.

Different stages of a method for manufacturing the semiconductor device 1A are shown in FIG. 2A, FIG. 2B, FIG. 2C, and FIG. 2D, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 2A:
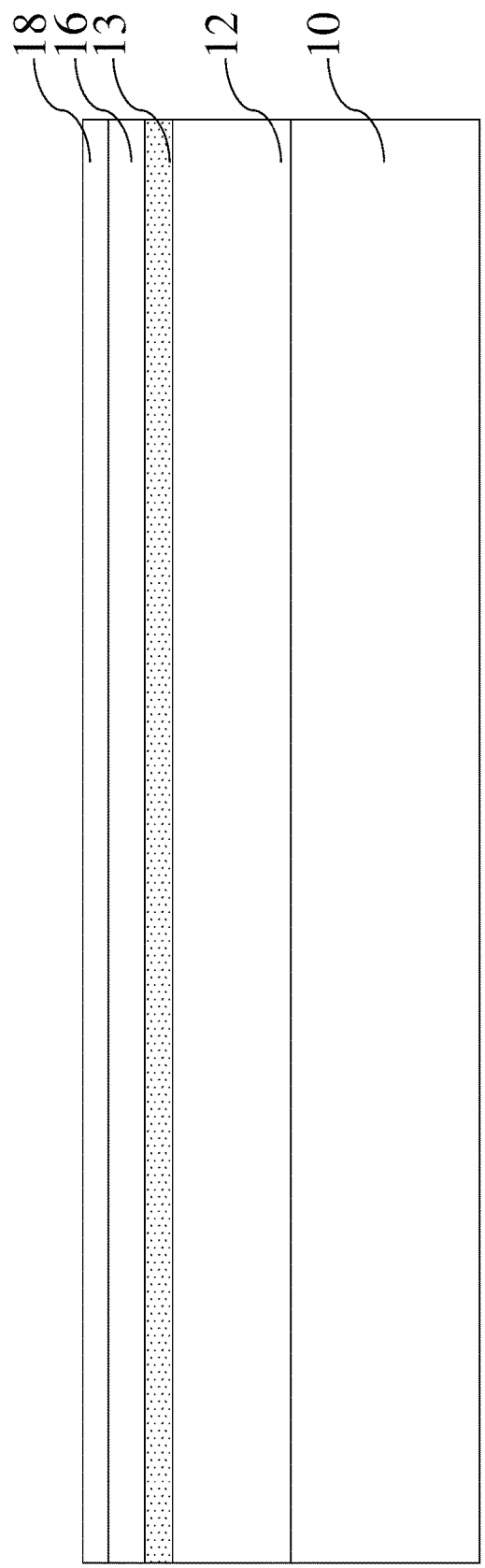
FIG. 2A, FIG. 2B, FIG. 2C, and FIG. 2D show different stages of a method for manufacturing a semiconductor device according to some embodiments of the present disclosure.

Referring to FIG. 2A, a substrate 10 is provided. A nitride-based semiconductor layer 12, a single III-V group semiconductor layer 13, and nitride-based semiconductor layers 16 and 18 can be formed over the substrate 10 in sequence by using deposition techniques. In some embodiments, implantation techniques can be used such that the nitride-based semiconductor layer 12 and the single III-V group semiconductor layer 13 are doped to have the desired conductivity type, as afore-mentioned.

Figure 2B:
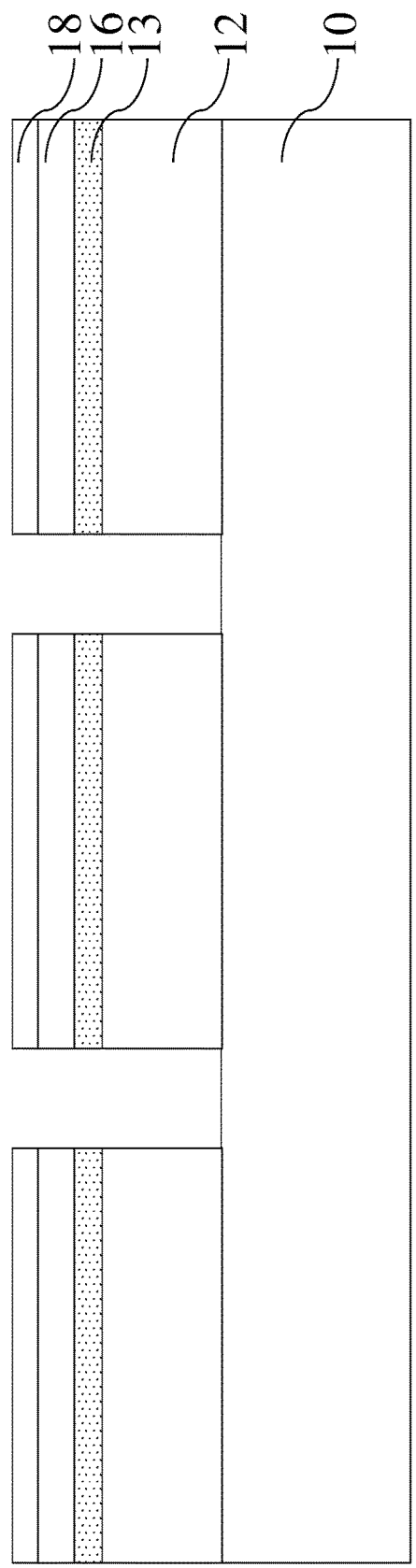

Referring to FIG. 2B, a die/device boundary is defined. The die/device boundary can be achieved by performing an etching process. After the etching process, portions of the nitride-based semiconductor layer 12, the single III-V group semiconductor layer 13, and the nitride-based semiconductor layers 16 and 18 can be removed to form recesses. The different dies/devices can be separated from each other by the corresponding recess. In some embodiments, performing the etching process is terminated after the single III-V group semiconductor layer 13 is divided into multiple separated portions. In some embodiments, after the etching process, some portions of the substrate 10 can be exposed from the recesses.

Figure 2C:
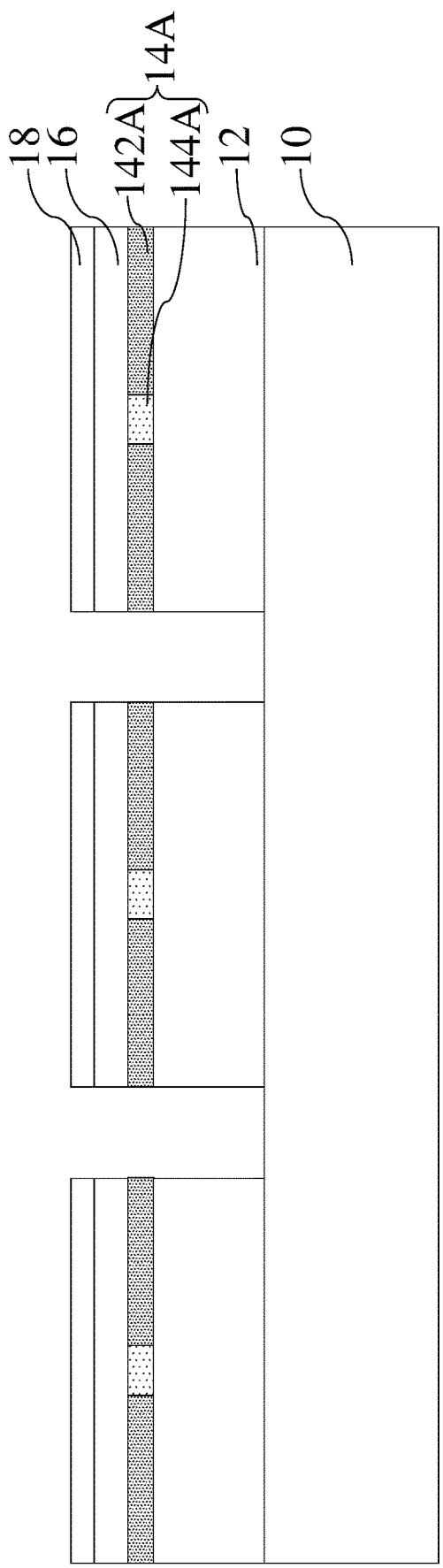

Referring to FIG. 2C, an oxidizing process is performed to laterally oxidize the single III-V group semiconductor layer 13, so at least one single III-V group semiconductor layer 14A including a high resistivity region 142A and a current aperture 144A is formed. During the oxidizing process, the single III-V group semiconductor layer 13 is laterally oxidized from sidewalls (i.e., the sidewalls adjacent to the recesses) to the inside thereof. The time point for terminating the oxidizing process is optional. For example, the oxidizing process can be terminated when the single III-V group semiconductor layer 14A has an oxidized portion (i.e., the high resistivity region 142A) to define a current aperture 144A in the middle.

Figure 2D:
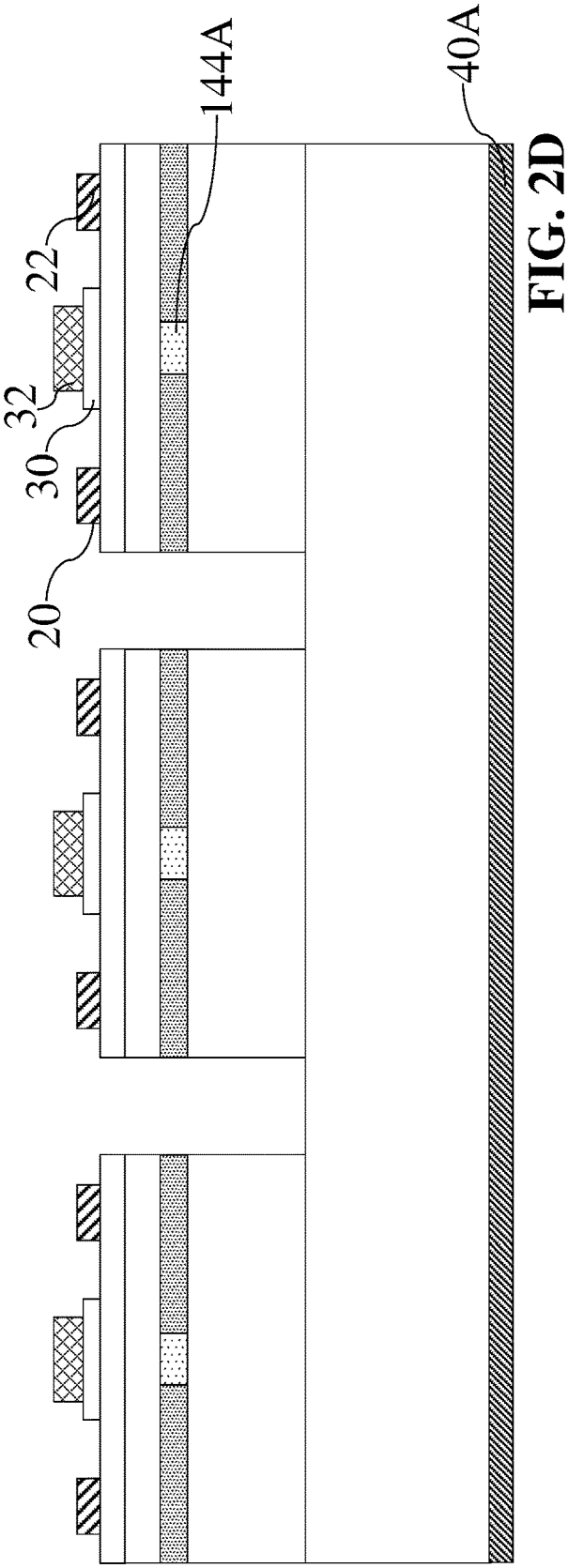

Referring to FIG. 2D, source electrodes 20 and 22, a doped nitride-based semiconductor 30, a gate electrode 32, and a drain electrode 40A are formed. The doped nitride-based semiconductor 30 and the gate electrode 32 are formed to align with the current aperture 144A, as afore mentioned. After the formation of the electrodes, a dicing process can be performed for separating the different devices. The recesses can serve as cutting lines in the dicing process. After the dicing process, the structure as shown in FIG. 1 is obtained.

Figure 3:
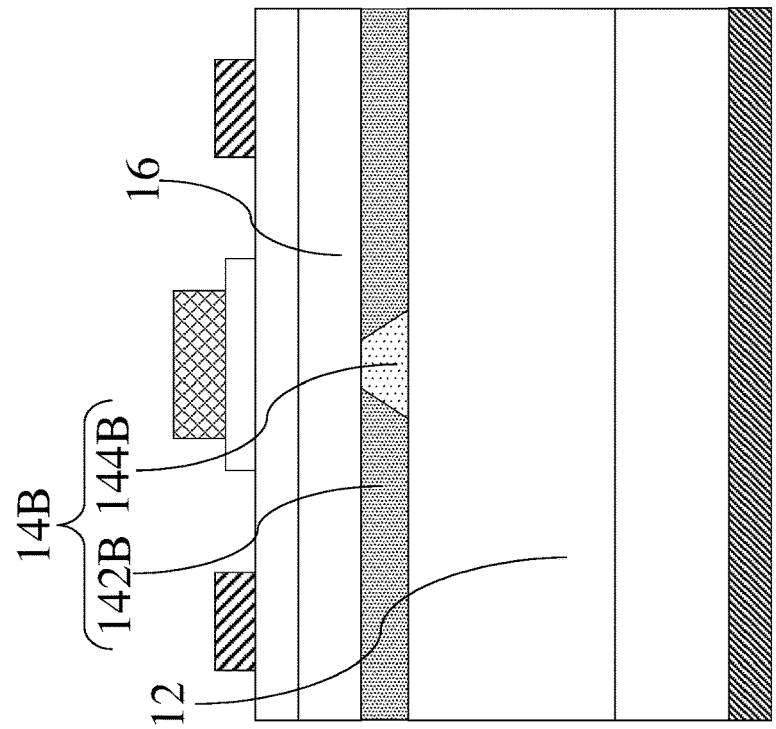
FIG. 3 is a vertical cross-sectional view of a semiconductor device according to some embodiments of the present disclosure.

FIG. 3 is a vertical cross-sectional view of a semiconductor device 1B according to some embodiments of the present disclosure. The semiconductor device 1B is similar to the semiconductor device 1A as described and illustrated with reference to FIG. 1, except that the single III-V group semiconductor layer 14A is replaced by a single III-V group semiconductor layer 14B.

The single III-V group semiconductor layer 14B has a high resistivity region 142B and a current aperture 144B. The high resistivity region 142B encloses/surrounds the current aperture 144B. The current aperture 144B has a width decreasing along a vertical direction. The vertical direction in the present embodiment is an upward direction pointing from the nitride-based semiconductor layer 12 to nitride-based semiconductor layer 16. The current aperture 144B having such the profile can be applied to different device design. For example, it can comply with a condition that current needs to be spread after passing through the current aperture 144B.

To achieve such the profile of the current aperture 144B, the single III-V group semiconductor layer 14B can have the concentration of the group III element changing along the vertical direction. The reason is that the oxidation degree of the tendency of the single III-V group semiconductor layer 14B is related to its aluminum concentration. As the higher aluminum concentration is, the tendency that a layer is to be oxidized gets higher. For example, the concentration of the group III of the single III-V group semiconductor layer 14B can increase along the vertical direction. The current aperture 144B has the gradient concentration of the group III element as well. In some embodiments, the concentration of the group III element is aluminum concentration. Therefore, the concentration at different levels of height is oxidized at different degrees, so the profile is formed.

Figure 4:
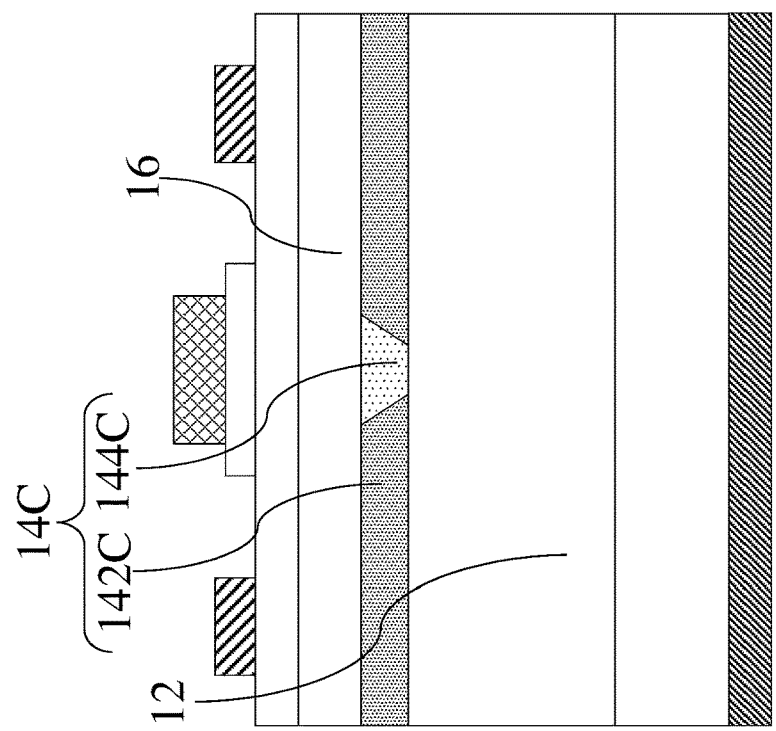
FIG. 4 is a vertical cross-sectional view of a semiconductor device according to some embodiments of the present disclosure.

FIG. 4 is a vertical cross-sectional view of a semiconductor device 1C according to some embodiments of the present disclosure. The semiconductor device 1C is similar to the semiconductor device 1A as described and illustrated with reference to FIG. 1, except that the single III-V group semiconductor layer 14A is replaced by a single III-V group semiconductor layer 14C.

The single III-V group semiconductor layer 14C has a high resistivity region 142C and a current aperture 144C. The high resistivity region 142C encloses/surrounds the current aperture 144C. The current aperture 144C has a width increasing along a vertical direction. The vertical direction in the present embodiment is an upward direction pointing from the nitride-based semiconductor layer 12 to nitride-based semiconductor layer 16. The current aperture 144C having such the profile can be applied to different device design. For example, it can comply with a condition that current needs to be converged after passing through the current aperture 144C.

To achieve such the profile of the current aperture 144C, the single III-V group semiconductor layer 14C can have the concentration of the group III element changing along the vertical direction. For example, the concentration of the group III of the single III-V group semiconductor layer 14B can decrease along the vertical direction. The current aperture 144C has the gradient concentration of the group III element as well. In some embodiments, the concentration of the group III element is aluminum concentration. Therefore, the concentration at different levels of height is oxidized at different degrees, so the profile is formed.

FIG. 5 is a vertical cross-sectional view of a semiconductor device 1D according to some embodiments of the present disclosure. The semiconductor device 1D is similar to the semiconductor device 1A as described and illustrated with reference to FIG. 1, except that the single III-V group semiconductor layer 14A is replaced by a single III-V group semiconductor layer 14D.

The single III-V group semiconductor layer 14D has a high resistivity region 142D and a current aperture 144D. The high resistivity region 142D encloses/surrounds the current aperture 144D. The current aperture 144C has a width decreasing and then increasing along a vertical direction. The vertical direction in the present embodiment is an upward direction pointing from the nitride-based semiconductor layer 12 to nitride-based semiconductor layer 16. The current aperture 144D having such the profile can be applied to different device design. For example, it can comply with a condition that current needs to be converged and then spread when passing through the current aperture 144D.

To achieve such the profile of the current aperture 144D, the single III-V group semiconductor layer 14D can have the concentration of the group III element changing along the vertical direction.

FIG. 6 is a vertical cross-sectional view of a semiconductor device 1E according to some embodiments of the present disclosure. The semiconductor device 1E is similar to the semiconductor device 1A as described and illustrated with reference to FIG. 1, except that the drain electrode 40A is replaced by a drain electrode 40E. The drain electrode is directly connected to the nitride-based semiconductor layer 12.

Different stages of a method for manufacturing the semiconductor device 1E are shown in FIG. 7A, FIG. 7B, FIG. 7C, and FIG. 7D, as described below. In the following, deposition techniques can include, for example but are not limited to, ALD, PVD, CVD, MOCVD, PECVD, LPCVD, plasma-assisted vapor deposition, epitaxial growth, or other suitable processes.

Figure 7A:
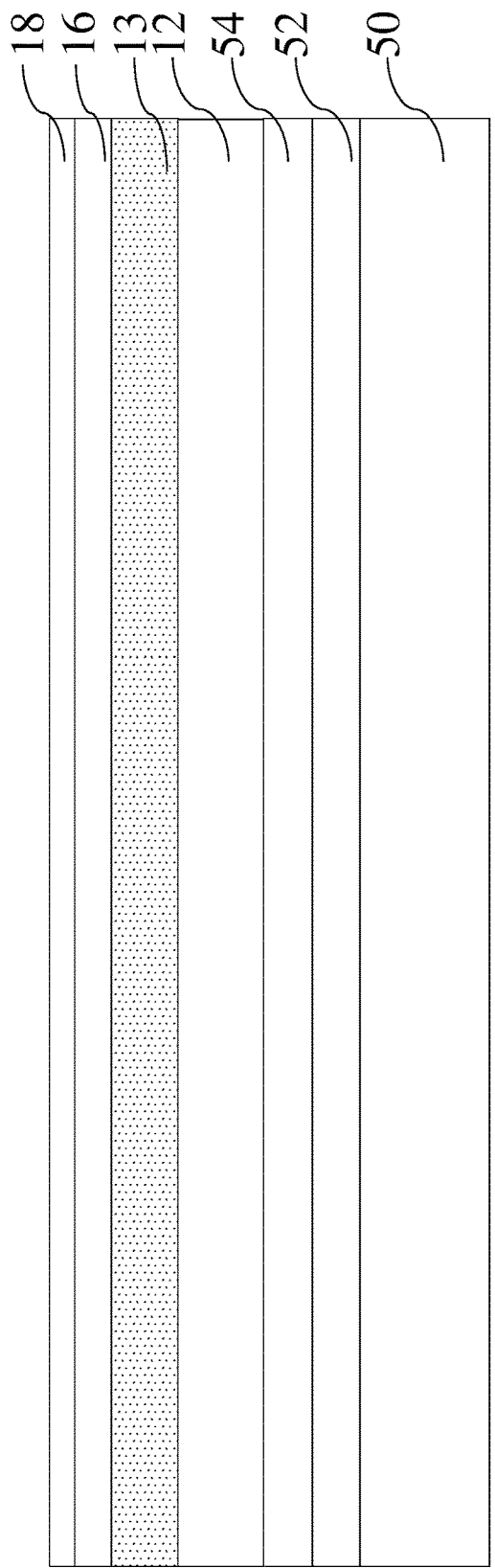
FIG. 7A, FIG. 7B, FIG. 7C, and FIG. 7D show different stages of a method for manufacturing a semiconductor device according to some embodiments of the present disclosure.

Referring to FIG. 7A, a substrate 50 is provided. A nucleation layer 52 and a buffer layer 54 can be formed over the substrate 50 in sequence by using deposition techniques. Thereafter, a nitride-based semiconductor layer 12, a single III-V group semiconductor layer 13, and nitride-based semiconductor layers 16 and 18 can be formed over the buffer layer 54 in sequence by using deposition techniques. In some embodiments, implantation techniques can be applied such that the nitride-based semiconductor layer 12 and the single III-V group semiconductor layer 13 are doped to have the desired conductivity type, as afore-mentioned.

Figure 7B:
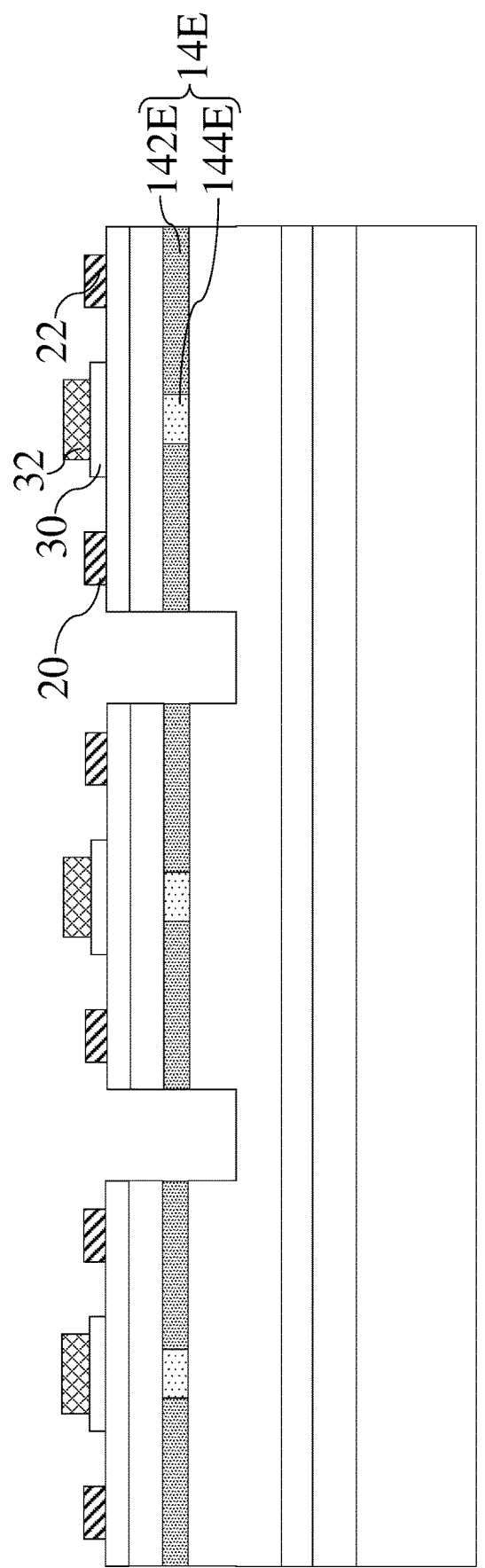

Referring to FIG. 7B, a die/device boundary is defined. As afore-described, after the boundary defined, an oxidizing process can be performed to laterally oxidize the single III-V group semiconductor layer 13, so at least one single III-V group semiconductor layer 14E including a high resistivity region 142E and a current aperture 144E is formed. Then, source electrodes 20 and 22, a doped nitride-based semiconductor 30, a gate electrode 32 are formed.

Figure 7C:
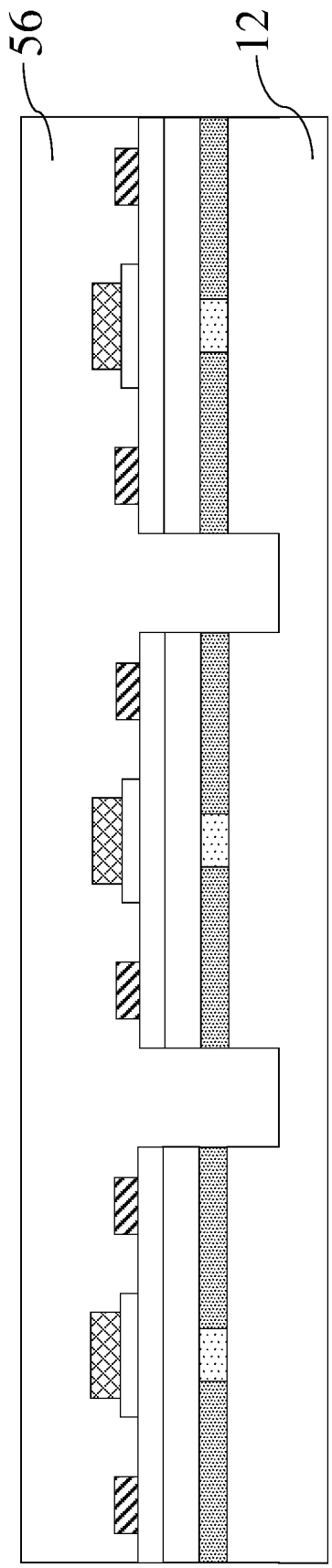

Referring to FIG. 7C, the resultant structure in FIG. 3C can held by a temporary substrate 56. As the structure is held by the temporary substrate 56, the nucleation layer 52, the buffer layer 54, and the substrate 50 can be removed from the structure. As such, a bottom surface of nitride-based semiconductor layer 12 is exposed.

Figure 7D:
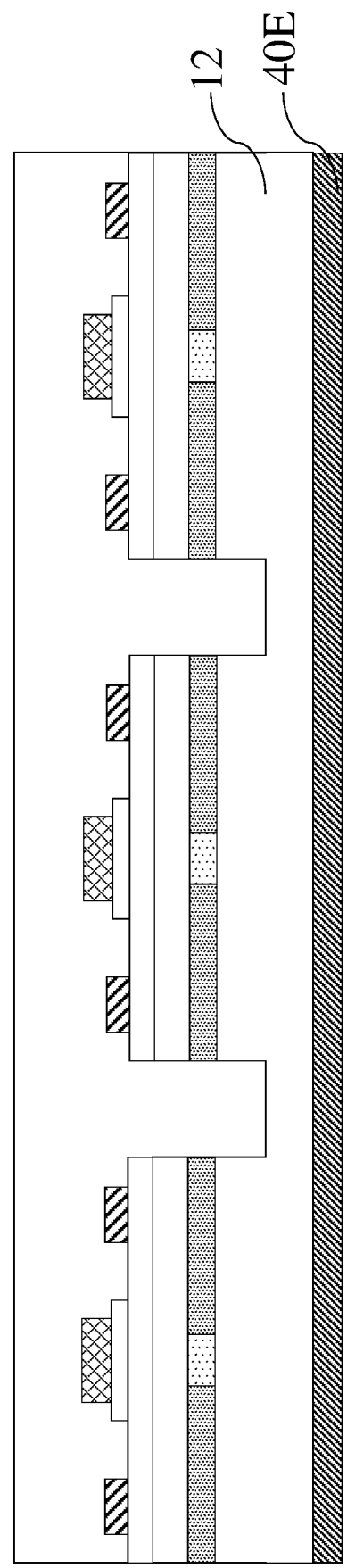

Referring to FIG. 7D, a drain electrode 40E is formed to connected to the bottom surface of nitride-based semiconductor layer 12. After the formation of the drain electrode 40E, a dicing process can be performed for separating the different devices. The recesses can serve as cutting lines in the dicing process. After the dicing process, the structure as shown in FIG. 6 is obtained.

Figure 8:
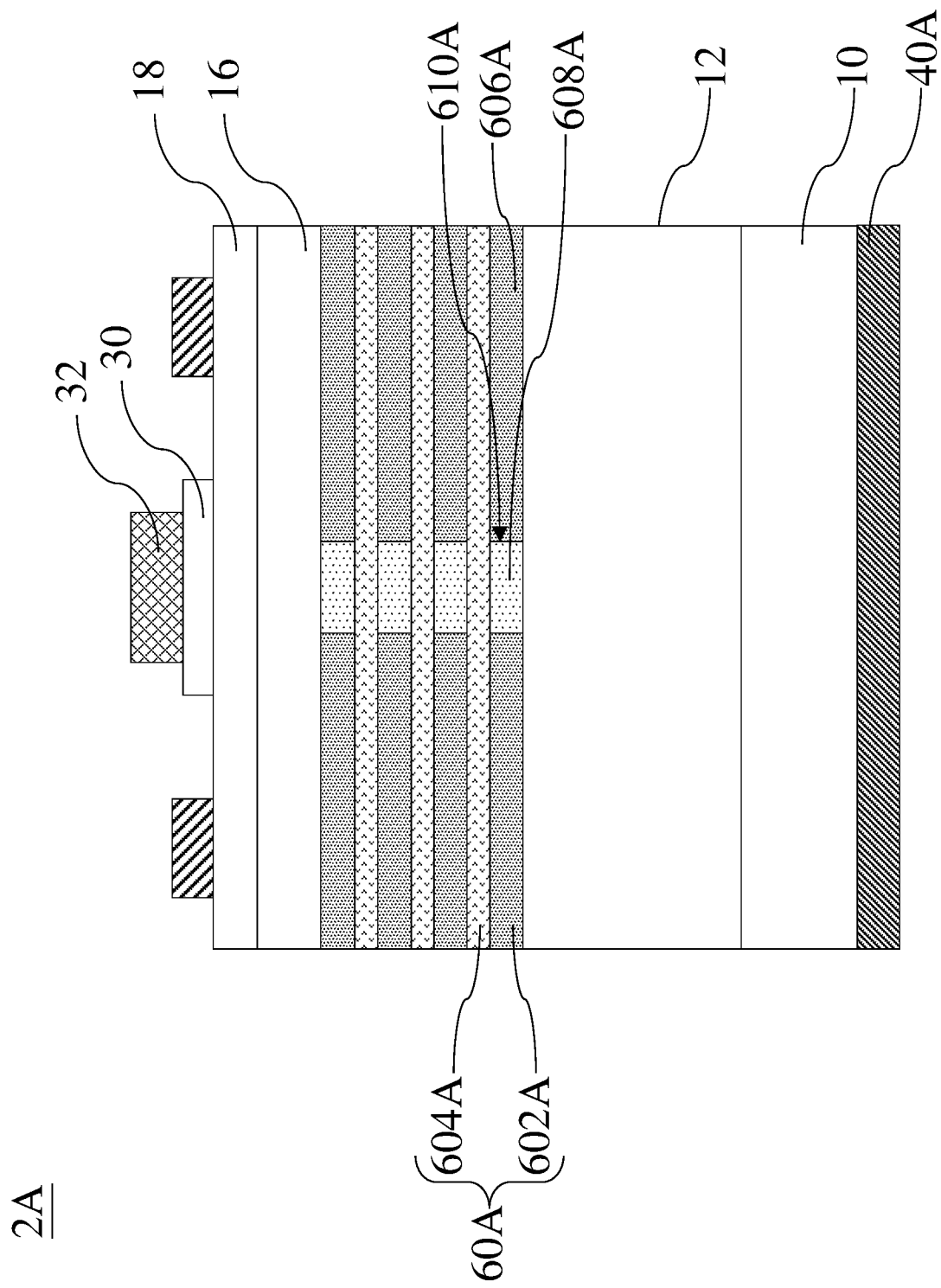
FIG. 8 is a vertical cross-sectional view of a semiconductor device according to some embodiments of the present disclosure.

FIG. 8 is a vertical cross-sectional view of a semiconductor device 2A according to some embodiments of the present disclosure. The semiconductor device 2A is similar to the semiconductor device 1A as described and illustrated with reference to FIG. 1, except that the single III-V group semiconductor layer 14A is replaced by a lattice layer 60A.

The lattice layer 60A is disposed between the nitride-based semiconductor layers 12 and 16. The lattice layer 60A is in contact with the nitride-based semiconductor layers 12 and 16.

The lattice layer 60A is doped to have the first conductivity type. The lattice layer 60A includes a plurality of III-V layers 602A and 604A. The III-V layers 602A and 604A are alternatively stacked on the nitride-based semiconductor layer 12. At least one pair of the III-V layers 602A are separated from the single III-V layer 604A.

Each of the III-V layers 602A has a high resistivity region 606A and a current aperture 608A enclosed by the high resistivity region 606A. The high resistivity region 606A includes more metal oxides than the current aperture 608A so as to achieve a resistivity higher than that of the current aperture, as afore described.

The high resistivity regions 606A can be formed by an oxidizing process as afore mentioned. To form high resistivity regions 606A, each of the III-V layers 602A of the lattice layer 60A includes a group III element. Each of the III-V layers 602A of the lattice layer 60 includes a group III element in its current aperture 608A. In some embodiments, each of the III-V layers 602A includes III-V ternary compound. For example, each of the III-V layers 602A includes InAlN. As the current aperture 608A includes InAlN, the high resistivity region 606A can further include aluminum oxide, such as $Al_2O_3$. The aluminum oxide of the high resistivity region 606A can be formed from InAlN by performing an oxidation process.

The resistivity of the high resistivity region 606A is higher than the resistivity of the current aperture 608A. Accordingly, the III-V layers 602A can have the resistivity changing laterally. Specifically, the high resistivity region 606A gets oxidized from the sidewall toward the middle of each of the III-V layers 602A, so the oxidation degree may decrease from the sidewall toward the middle of each the III-V layers 602A. The oxidation degree is in positive correlation to the resistivity, so the high resistivity region 606A can have the resistivity changing laterally. The resistivity of each of the III-V layers 602A greatly changes form relatively high to relatively low at an interface 610A formed between the high resistivity region 606A and the current aperture 608A.

Before performing the oxidation process, the III-V layers 602A can have the same V/III ratio. Before performing the oxidation process, the III-V layers 602A can have the same aluminum ratio. Before performing the oxidation process, the III-V layers 602A can have the same III-V distribution. Therefore, at the stage of performing the oxidation process, the III-V layers 602A have substantially the same condition to be oxidized. After performing the oxidation process, the distribution range of the high resistivity regions 604A in the different III-V layers 602A can be substantially the same.

More specifically, with respect to each the III-V layer 602A, an interface 610A is formed between the high resistivity region 606A and the current aperture 608A. Those interfaces 610A among the III-V layers 602A can substantially align with each other. The current apertures 608A vertically overlap with each other. Vertical projections of the current apertures 608A on the nitride-based semiconductor layer 12 have borders (opposite borders, such as left and right borders) coinciding with each other.

The nitride-based semiconductor layer 30 and the gate electrode 32 align with the current aperture 608A. The nitride-based semiconductor layer 30 has a width greater than those of the current apertures 608A. The gate electrode 32 has a width greater than those of the current apertures 608A.

The III-V layers 604A have different element composition than that of the III-V layers 602A. For example, each of the III-V layers 602A includes III-V ternary compound, and each of the III-V layers 604A includes III-V binary compound. In some embodiments, each of the III-V layers 602A includes InAlN, and each of the III-V layers 604A is devoid of aluminum. In some embodiments, each of the III-V layers 602A includes InAlN, and each of the III-V layers 604A includes GaN.

Since the III-V layers 602A and the III-V layers 604A have different element compositions, the oxidization conditions for them are different well. In some embodiments, an average concentration of oxygen in the III-V layers 602A is greater than an average concentration of oxygen in the III-V layers 604A. In some embodiments, the III-V layers 604A can be free from oxidization so an average concentration of oxygen in the III-V layers 604A approaches zero or is about zero.

Since at least one pair of the III-V layers 602A are separated from the single III-V layer 604A, the two adjacent current apertures 608A are spaced apart from each other by the corresponding III-V layer 604A as well.

The lattice layer 60A can avoid misfit dislocation formation, so as to reduce occurrence of cracks or layer defects in epitaxial growth, thereby improving the yield rate of the semiconductor device 2A. The performance of the semiconductor device 2A can be improved as well due to the reduction of layer defects (e.g., surface states).

The manner for forming the high resistivity regions 606A and the current apertures 608A can be brought to the semiconductor device 2A including the lattice layer 60A. Such the manner is free from an etching step so the yield plate of the manufacturing process can remain. The manner achieved by performing an oxidizing process is highly compatible with the GaN-based HEMT devices. The manufacturing process for the semiconductor device 2A is similar with that of semiconductor device 1A, except the formation of the single III-V group semiconductor layer is replace by the formation of the lattice layer 60A, which can be formed by alternatively stacking two kinds of III-V layers.

Figure 9:
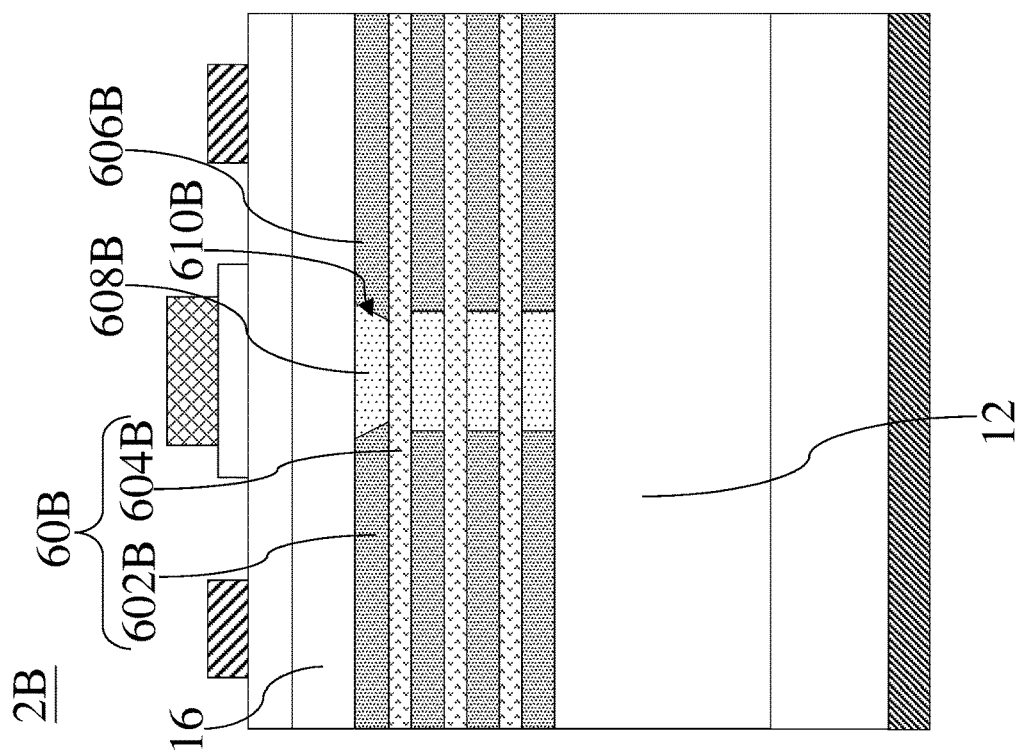
FIG. 9 is a vertical cross-sectional view of a semiconductor device according to some embodiments of the present disclosure.

FIG. 9 is a vertical cross-sectional view of a semiconductor device 2B according to some embodiments of the present disclosure. The semiconductor device 2B is similar to the semiconductor device 2A as described and illustrated with reference to FIG. 8, except that the lattice layer 60A is replaced by a lattice layer 60B.

The lattice layer 60B includes a plurality of III-V layers 602B and 604B. The III-V layers 602B and 604B are alternatively stacked on the nitride-based semiconductor layer 12. Each of the III-V layers 602B has a high resistivity region 606B and a current aperture 608B enclosed by the high resistivity region 606B.

The top-most one of the III-V layers 602B is in contact with the nitride-based semiconductor layer 16. In the top-most one of the III-V layers 602B, an interface formed between the high resistivity region 606B and the current aperture 608B can have a profile different than that in other of the III-V layers 602B.

In the top-most one of the III-V layers 602B, the current aperture 608B has a width increasing along an upward direction. The current aperture 608B having such the profile can be applied to different device design. For example, it can comply with a condition that current needs to be converged after passing through the current aperture 608B in the top-most one of the III-V layers 602B. To achieve such the profile of the current aperture 608B, the top-most one of the III-V layers 602B can have the concentration of the group III element changing along the upward direction. For example, the concentration of the group III of the top-most one of the III-V layers 602B can decrease along the upward direction.

Figure 10:
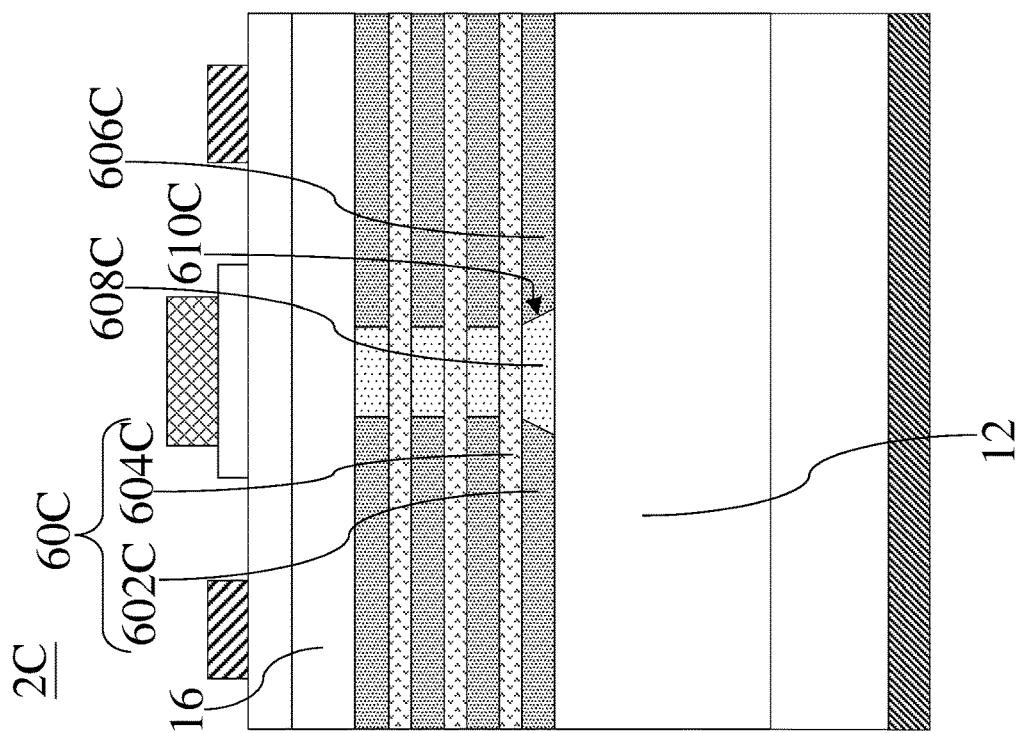
FIG. 10 is a vertical cross-sectional view of a semiconductor device according to some embodiments of the present disclosure.

FIG. 10 is a vertical cross-sectional view of a semiconductor device 2C according to some embodiments of the present disclosure. The semiconductor device 2C is similar to the semiconductor device 2A as described and illustrated with reference to FIG. 8, except that the lattice layer is replaced by a lattice layer 60C.

The lattice layer 60C includes a plurality of III-V layers 602C and 604C. The III-V layers 602C and 604C are alternatively stacked on the nitride-based semiconductor layer 12. Each of the III-V layers 602C has a high resistivity region 606C and a current aperture 608C enclosed by the high resistivity region 606C.

The bottom-most one of the III-V layers 602C is in contact with the nitride-based semiconductor layer 12. In the bottom-most one of the III-V layers 602C, an interface formed between the high resistivity region 606C and the current aperture 608C can have a profile different than that in other of the III-V layers 602C.

In the bottom-most one of the III-V layers 602C, the current aperture 608C has a width decreasing along an upward direction. The current aperture 608C having such the profile can be applied to different device design. For example, it can comply with a condition that current needs to be spread after passing through the current aperture 608C in the bottom-most one of the III-V layers 602C. To achieve such the profile of the current aperture 608C, the bottom-most one of the III-V layers 602C can have the concentration of the group III element changing along the upward direction. For example, the concentration of the group III of the bottom-most one of the III-V layers 602C can increase along the upward direction.

Figure 11:
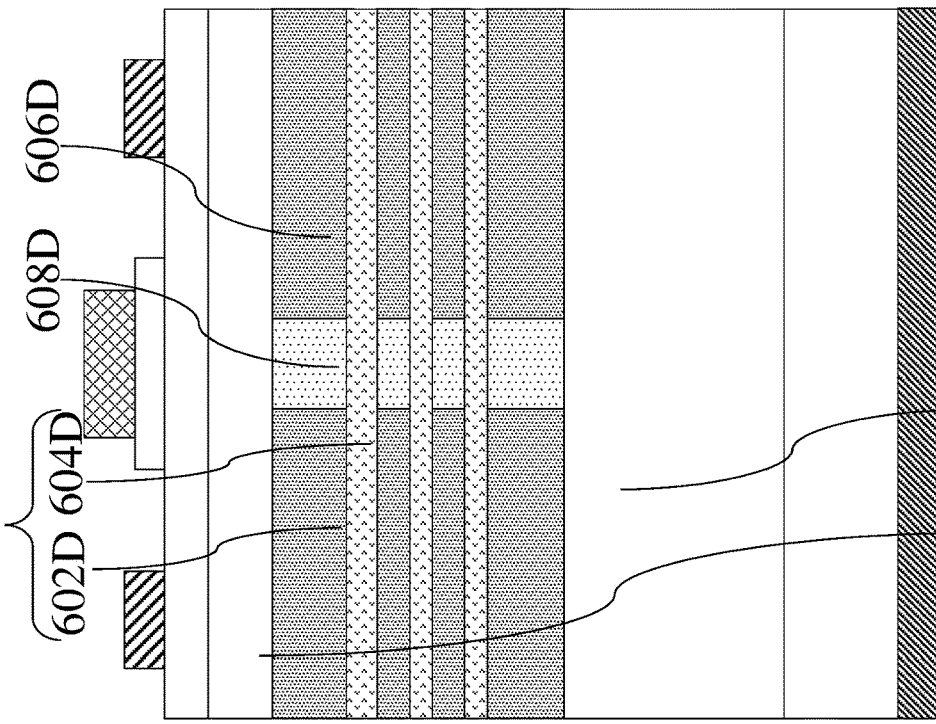
FIG. 11 is a vertical cross-sectional view of a semiconductor device according to some embodiments of the present disclosure.

FIG. 11 is a vertical cross-sectional view of a semiconductor device 2D according to some embodiments of the present disclosure. The semiconductor device 2D is similar to the semiconductor device 2A as described and illustrated with reference to FIG. 8, except that the lattice layer is replaced by a lattice layer 60D.

The lattice layer 60D includes a plurality of III-V layers 602D and 604D. The III-V layers 602D and 604D are alternatively stacked on the nitride-based semiconductor layer 12. Each of the III-V layers 602D has a high resistivity region 606D and a current aperture 608D enclosed by the high resistivity region 606D.

The bottom-most one of the III-V layers 602D is in contact with the nitride-based semiconductor layer 12. The top-most one of the III-V layers 602D is in contact with the nitride-based semiconductor layer 16. The bottom-most one and the top-most one of the III-V layers 602D can be formed to be thicker than others of the III-V layers 602D, so the current aperture 608D of them have longer lengths along a vertical direction than others. The current aperture 608D having the longer lengths can direct at least one current by a longer path, so as to avoid unexpected diffusion of the current.

Figure 12:
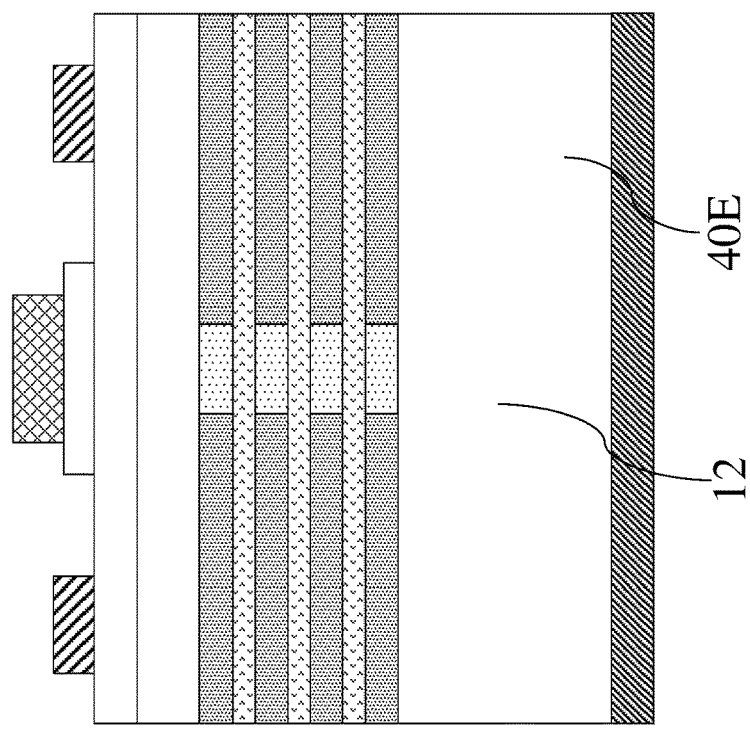
FIG. 12 is a vertical cross-sectional view of a semiconductor device according to some embodiments of the present disclosure.

FIG. 12 is a vertical cross-sectional view of a semiconductor device 2E according to some embodiments of the present disclosure. The semiconductor device 2E is similar to the semiconductor device 2A as described and illustrated with reference to FIG. 8, except that the drain electrode 40A is replaced by a drain electrode 40E. The drain electrode is directly connected to the nitride-based semiconductor layer 12.

Figure 13:
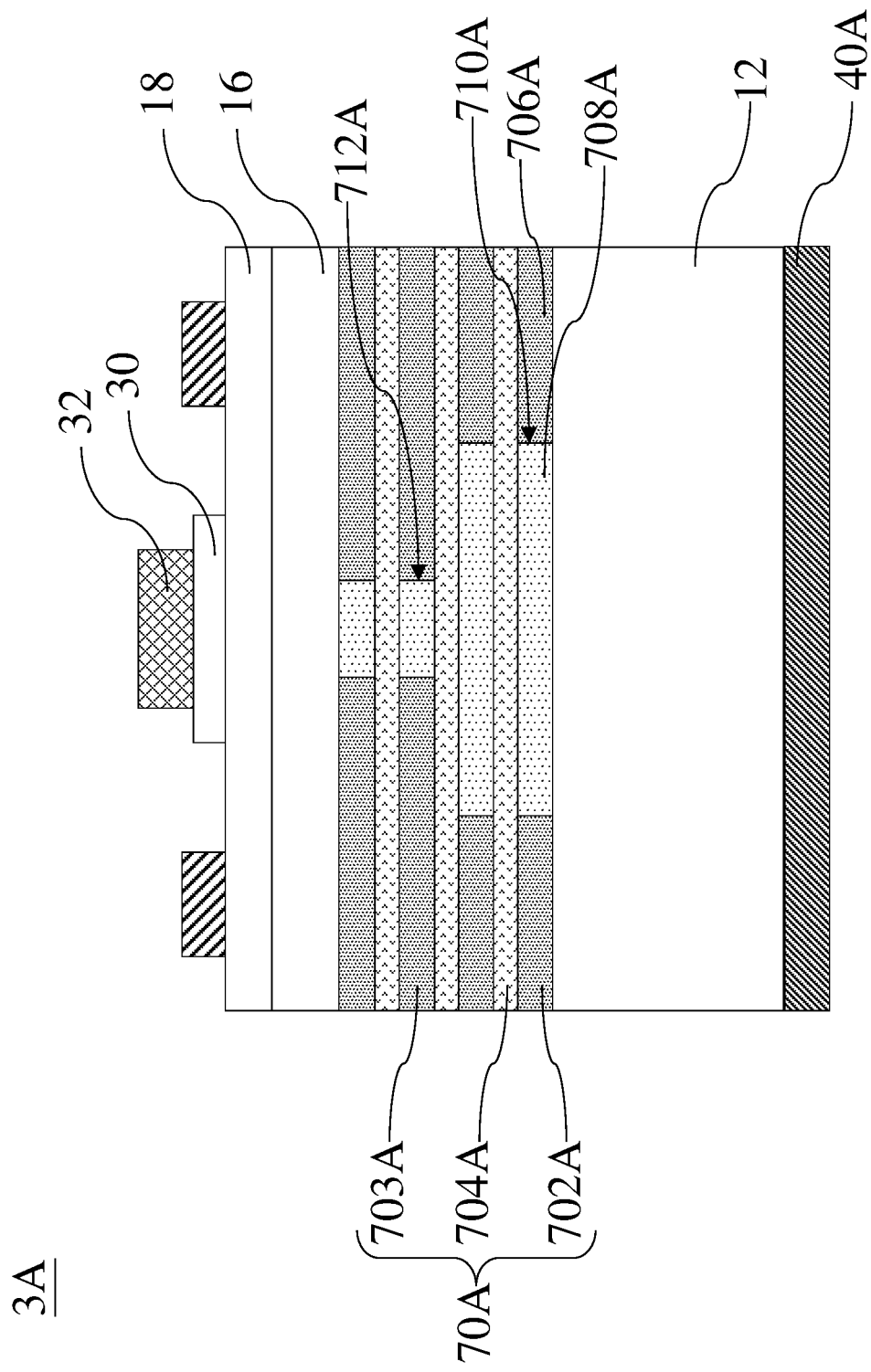
FIG. 13 is a vertical cross-sectional view of a semiconductor device according to some embodiments of the present disclosure.

FIG. 13 is a vertical cross-sectional view of a semiconductor device 3A according to some embodiments of the present disclosure. The semiconductor device 3A is similar to the semiconductor device 1A as described and illustrated with reference to FIG. 1, except that the single III-V group semiconductor layer 14A is replaced by a lattice layer 70A.

The lattice layer 70A is disposed between the nitride-based semiconductor layers 12 and 16. The lattice layer 70A is in contact with the nitride-based semiconductor layers 12 and 16.

The lattice layer 70A is doped to have the first conductivity type. The lattice layer 70A includes a plurality of III-V layers 702A, 703A, and 704A. The III-V layers 702A are disposed between the nitride-based semiconductor layer 12 and the III-V layers 703A. The III-V layers 702A and 704A are alternatively stacked on the nitride-based semiconductor layer 12. At least one pair of the III-V layers 702A are separated from the single III-V layer 704A. The III-V layers 703A and 704A are alternatively stacked over the III-V layers 702A. At least one pair of the III-V layers 703A are separated from the single III-V layer 704A. The top-most one of the III-V layers 702A and the bottom-most one of the III-V layers 703A is separated from each other by the single III-V layer 704A.

Each of the III-V layers 702A and 703A has a high resistivity region 706A and a current aperture 708A enclosed by the high resistivity region 706A. The high resistivity region 706A includes more metal oxides than the current aperture 708A so as to achieve a resistivity higher than that of the current aperture, as afore described.

The high resistivity regions 706A can be formed by an oxidizing process as afore mentioned. To form high resistivity regions 706A, each of the III-V layers 702A and 703A of the lattice layer 70A includes a group III element. Each of the III-V layers 702A and 703A of the lattice layer 70A includes a group III element in the respective current aperture 708A. In some embodiments, each of the III-V layers 702A and 703A includes III-V ternary compound. For example, each of the III-V layers 702A and 703A includes InAlN. As the current aperture 708A of each of the III-V layers 702A and 703A includes InAlN, the high resistivity region 706A can further include aluminum oxide, such as $Al_2O_3$. The aluminum oxide of the high resistivity region 706A can be formed from InAlN by performing an oxidation process.

Before performing the oxidation process, the III-V layers 702A and 703A can have different V/III ratios. Before performing the oxidation process, the III-V layers 702A and 703A can have different aluminum ratios.

Before performing the oxidation process, the III-V layers 702A and 703A can have different III-V distributions. Therefore, at the stage of performing the oxidation process, the III-V layers 702A and 703A have different condition to be oxidized.

To achieve the III-V layers 702A and 703A having different V/III ratios or/and different III-V distributions, the III-V layers 702A and 703A can have different concentrations of a group III element. That is, the III-V layers 702A and 703A can have the same group III element at different concentrations. For example, the III-V layers 702A and 703A may have aluminum at different concentrations. The III-V layers 703A can have an aluminum concentration greater than that of the III-V layers 702A.

In some embodiments, at least one of the III-V layers 702A and 703A has the concentration of the group III element that is lateral homogeneous. For example, at least one of the III-V layers 702A and 703A have an aluminum concentration that is lateral homogeneous. The homogeneous aluminum concentration is advantageous to the formation of the III-V layers 702A and 703A.

After performing the oxidation process, the distribution range of the high resistivity regions 706A in the III-V layers 702A and 703A are different. Accordingly, the current apertures 708A of the III-V layers 702A and 703A have different dimensions. For example, the current apertures 708A of the III-V layers 702A, which are located between the nitride-based semiconductor layer 12 and the current apertures 708A of the III-V layers 703A, are wider than the current apertures 708A of the III-V layers 703A. In some embodiments, the current apertures 708A of the III-V layers 702A have the same width. In some embodiments, the current apertures 708A of the III-V layers 703A have the same width.

More specifically, with respect to each the III-V layer 702A, an interface 710A is formed between the high resistivity region 706A and the current aperture 708A thereof; and with respect to each the III-V layer 703A, an interface 712A is formed between the high resistivity region 706A and the current aperture 708A thereof. Those interfaces 710A and 712A among the III-V layers 702A and 703A can misalign with each other.

Those misaligned interfaces 710A and 712A are spaced apart from a sidewall of the lattice layer 70A by different distances. For example, a distance from the sidewall of the lattice layer 70A to each of the interfaces 710A is shorter than a distance from the sidewall of the lattice layer 70A to each of the interfaces 712A. Vertical projections of the current apertures 708A of the III-V layers 702A and 703A on the nitride-based semiconductor layer 12 have borders (opposite borders, such as left and right borders) spaced apart from each other.

The nitride-based semiconductor layer 30 and the gate electrode 32 align with the current apertures 708A of the III-V layers 702A and 703A. The nitride-based semiconductor layer 30 has a width greater than those of the current apertures 708A of the III-V layers 703A. The gate electrode 32 has a width greater than those of the current apertures 708A of the III-V layers 703A. The nitride-based semiconductor layer 30 has a width less than those of the current apertures 708A of the III-V layers 702A. The gate electrode 32 has a width less than those of the current apertures 708A of the III-V layers 702A.

Furthermore, since the III-V layers 702A and 703A have different group III element concentrations, the current apertures 708A of the III-V layers 702A and 703A may have different group III element concentrations as well. For example, the current apertures 708A of the III-V layers 702A and 703A may have different aluminum concentrations. That is, the current apertures 708A of the III-V layers 702A and 703A can have the same group III element at different concentrations.

Similarly, the high resistivity regions 706A of the III-V layers 702A and 703A may have the same group III element at different concentrations. For example, the high resistivity regions 706A of the III-V layers 702A and 703A may have different aluminum concentrations or different oxygen concentrations. The high resistivity regions 706A of the III-V layers 702A and 703A may have different aluminum ratios. As such, the high resistivity regions 706A of the III-V layers 702A and 703A may have different resistivities.

The III-V layers 704A have different element composition than that of the III-V layers 702A and 703A. For example, each of the III-V layers 702A and 703A includes III-V ternary compound, and each of the III-V layers 704A includes III-V binary compound. In some embodiments, each of the III-V layers 702A and 703A includes InAlN, and each of the III-V layers 704A is devoid of aluminum. In some embodiments, each of the III-V layers 702A and 703A includes InAlN, and each of the III-V layers 704A includes GaN.

Since the III-V layers 702A and 703A and the III-V layers 704A have different element compositions, the oxidization conditions for them are different well. In some embodiments, an average concentration of oxygen in the III-V layers 702A and 703A is greater than an average concentration of oxygen in the III-V layers 704A. In some embodiments, the III-V layers 704A can be free from oxidization so an average concentration of oxygen in the III-V layers 704A approaches zero or is about zero.

Since at least one pair of the III-V layers 702A and 703A are separated from the single III-V layer 704A, the two adjacent current apertures 708A of the III-V layers 702A and 703A are spaced apart from each other by the corresponding III-V layer 704A as well.

The lattice layer 70A can avoid misfit dislocation formation, so as to reduce occurrence of cracks or layer defects in epitaxial growth, thereby improving the yield rate of the semiconductor device 3A. The performance of the semiconductor device 3A can be improved as well due to the reduction of layer defects (e.g., surface states).

The manner for forming the high resistivity regions 706A and the current apertures 708A can be brought to the semiconductor device 3A including the lattice layer 70A. As afore mentioned, such the manner is free from an etching step so the yield plate of the manufacturing process can remain.

In addition, since the current apertures 708A of the III-V layers 703A are narrower than the current apertures 708A of the III-V layers 702A, at least one current passing through the lattice layer 70A can get converged and then diffused, which is adaptable to a vertical HEMT structure. Lateral current leakage can be reduced and current passing through the lattice layer can be collected by the drain electrode 40A well.

Figure 14:
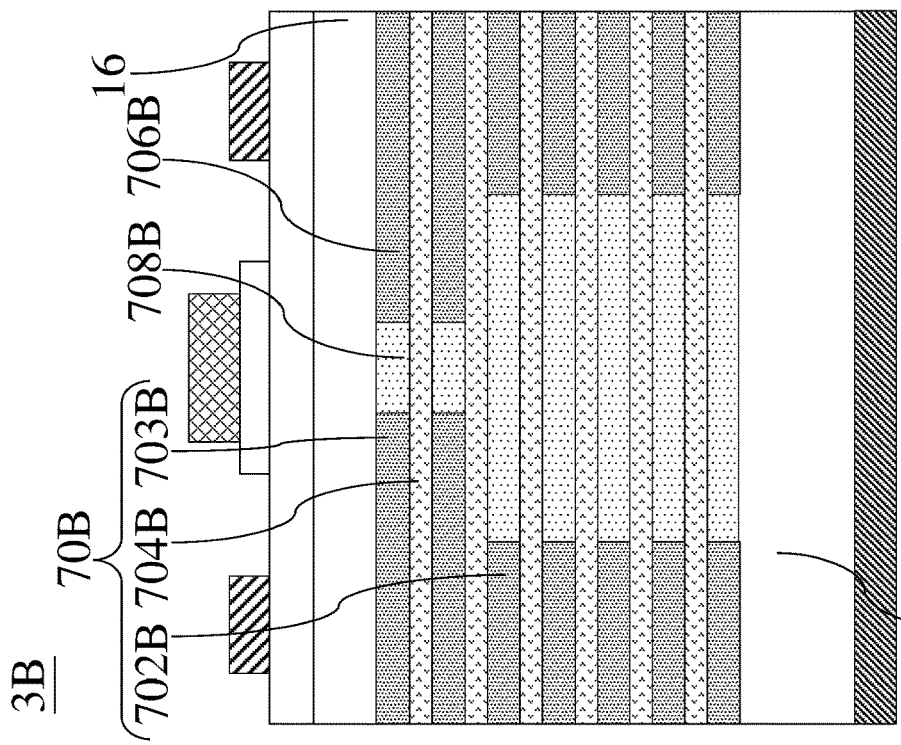
FIG. 14 is a vertical cross-sectional view of a semiconductor device according to some embodiments of the present disclosure.

FIG. 14 is a vertical cross-sectional view of a semiconductor device 3B according to some embodiments of the present disclosure. The semiconductor device 3B is similar to the semiconductor device 3A as described and illustrated with reference to FIG. 13, except that lattice layer is replaced by a lattice layer 70B.

The lattice layer 70B is disposed between the nitride-based semiconductor layers 12 and 16. The lattice layer 70B is in contact with the nitride-based semiconductor layers 12 and 16.

The lattice layer 70B is doped to have the first conductivity type. The lattice layer 70B includes a plurality of III-V layers 702B, 703B, and 704B. The III-V layers 702B are disposed between the nitride-based semiconductor layer 12 and the III-V layers 703B. The III-V layers 702B and 704B are alternatively stacked on the nitride-based semiconductor layer 12. At least one pair of the III-V layers 702B are separated from the single III-V layer 704B. The III-V layers 703B and 704B are alternatively stacked over the III-V layers 702B. At least one pair of the III-V layers 703B are separated from the single III-V layer 704B.

Each of the III-V layers 702B and 703B has a high resistivity region 706B and a current aperture 708B enclosed by the high resistivity region 706B. The high resistivity region 706B includes more metal oxides than the current aperture 708B so as to achieve a resistivity higher than that of the current aperture, as afore described.

The number of the III-V layers 702B is greater than the number of the III-V layers 703B. Accordingly, the number of the current apertures 708B of the III-V layers 702B is greater than the number of the current apertures 708B of the III-V layers 703B. In other embodiments, the number of the III-V layers 702B is less than the number of the III-V layers 703B. The greater number of the current apertures 708B of the III-V layers 702B can provide current diffusion effect in a longer path.

Figure 15:
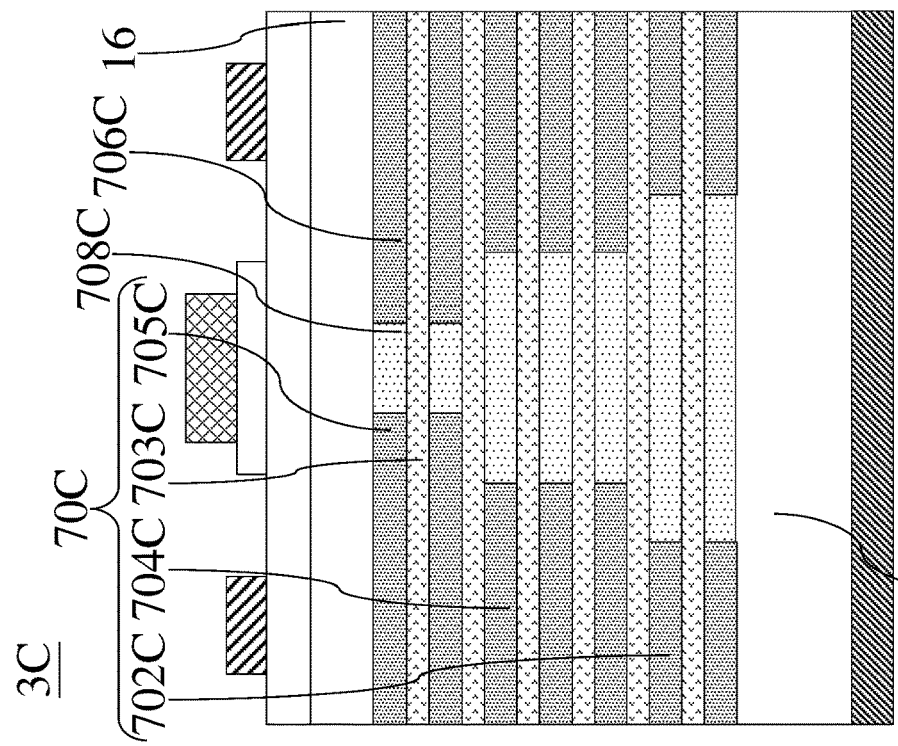
FIG. 15 is a vertical cross-sectional view of a semiconductor device according to some embodiments of the present disclosure.

FIG. 15 is a vertical cross-sectional view of a semiconductor device 3C according to some embodiments of the present disclosure. The semiconductor device 3C is similar to the semiconductor device 3A as described and illustrated with reference to FIG. 13, except that lattice layer is replaced by a lattice layer 70C.

The lattice layer 70C is disposed between the nitride-based semiconductor layers 12 and 16. The lattice layer 70C is in contact with the nitride-based semiconductor layers 12 and 16.

The lattice layer 70C is doped to have the first conductivity type. The lattice layer 70C includes a plurality of III-V layers 702C, 703C, 705C, and 704C. The III-V layers 702C are disposed between the nitride-based semiconductor layer 12 and the III-V layers 703B. The III-V layers 703C are disposed between the III-V layers 702C and 705C. The III-V layers 705C are disposed between the III-V layers 703C and the nitride-based semiconductor layer 16.

Each of the III-V layers 702C, 703C, and 705C has a high resistivity region 706C and a current aperture 708C enclosed by the high resistivity region 706C. The high resistivity region 706C includes more metal oxides than the current aperture 708C so as to achieve a resistivity higher than that of the current aperture, as afore described.

The current aperture 708C of each of the III-V layers 702C is wider than the current aperture 708C of each of the III-V layers 703C. The current aperture 708C of each of the III-V layers 703C is wider than the current aperture 708C of each of the III-V layers 705C. As such, the lattice layer 70C can provide current diffusion effect in a path with a gradually increasing wide.

Figure 16:
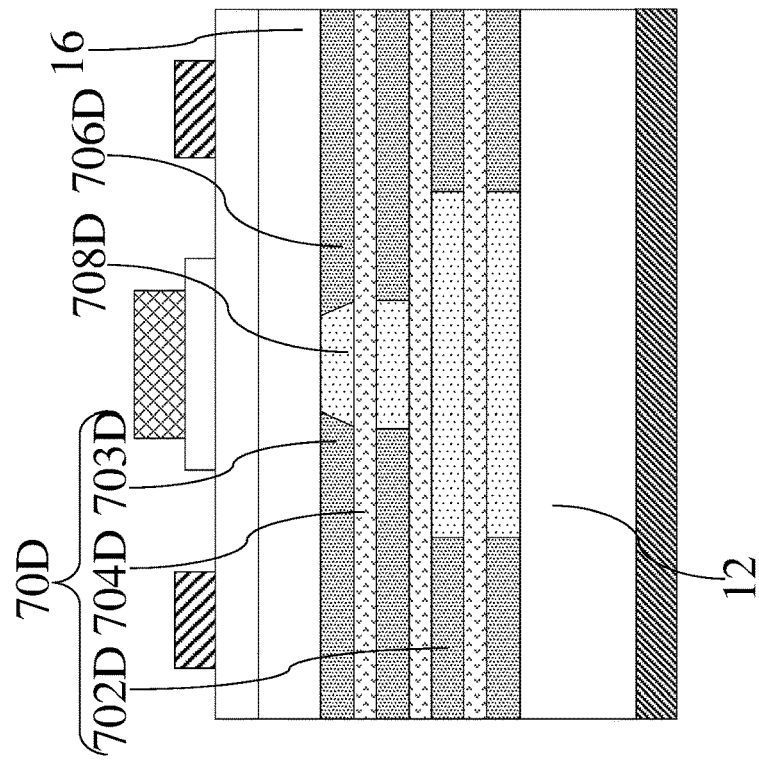
FIG. 16 is a vertical cross-sectional view of a semiconductor device according to some embodiments of the present disclosure.

FIG. 16 is a vertical cross-sectional view of a semiconductor device 3D according to some embodiments of the present disclosure. The semiconductor device 3D is similar to the semiconductor device 3A as described and illustrated with reference to FIG. 13, except that lattice layer is replaced by a lattice layer 70D.

The lattice layer 70D is disposed between the nitride-based semiconductor layers 12 and 16. The lattice layer 70D is in contact with the nitride-based semiconductor layers 12 and 16.

The lattice layer 70D is doped to have the first conductivity type. The lattice layer 70D includes a plurality of III-V layers 702D, 703D, and 704D. The III-V layers 702D are disposed between the nitride-based semiconductor layer 12 and the III-V layers 703D. The III-V layers 703C are disposed between the III-V layers 702D and the nitride-based semiconductor layer 16.

Each of the III-V layers 702D and 703D has a high resistivity region 706D and a current aperture 708D enclosed by the high resistivity region 706D. The high resistivity region 706D includes more metal oxides than the current aperture 708D so as to achieve a resistivity higher than that of the current aperture, as afore described.

The top-most one of the III-V layers 703D is in contact with the nitride-based semiconductor layer 16. The current aperture 708D of the top-most one of the III-V layers 703D has a wide decreasing along a vertical upward direction. To achieve it, the current aperture 708D of the top-most one of the III-V layers 703D has the concentration of the group III element increasing along the vertical upward direction. In other embodiments, the current aperture 708D of the top-most one of the III-V layers 703D can have a wide increasing along a vertical upward direction. Also, in such the embodiment, the current aperture 708D of the top-most one of the III-V layers 703D has the concentration of the group III element decreasing along the vertical upward direction.

Figure 17:
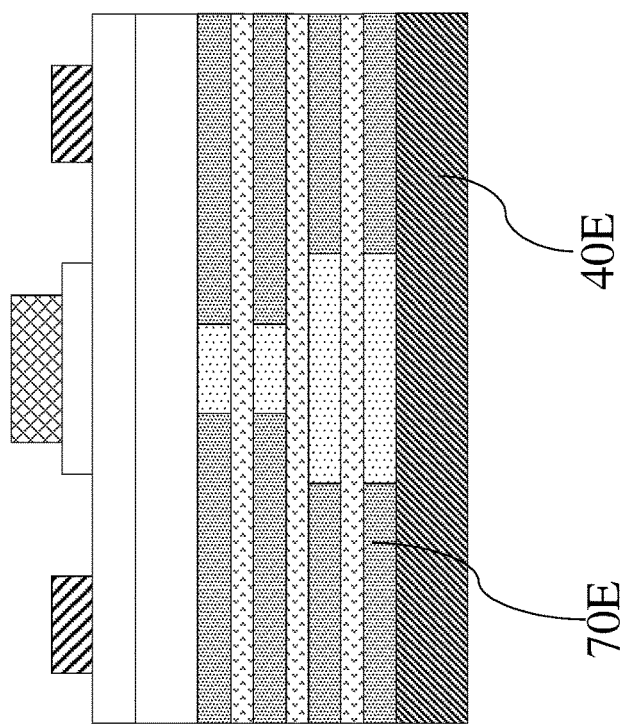
FIG. 17 is a vertical cross-sectional view of a semiconductor device according to some embodiments of the present disclosure.

FIG. 17 is a vertical cross-sectional view of a semiconductor device 3E according to some embodiments of the present disclosure. The semiconductor device 3E is similar to the semiconductor device 3A as described and illustrated with reference to FIG. 13, except that the drain electrode 40A is replaced by a drain electrode 40E. The drain electrode is directly connected to a lattice layer 70E.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device, comprising:
   a first nitride-based semiconductor layer doped to a first conductivity type;
   a second nitride-based semiconductor layer disposed over the first nitride-based semiconductor layer;
   a single III-V group semiconductor layer disposed between the first and second nitride-based semiconductor layers and doped to the first conductivity type, wherein the single III-V group semiconductor layer has a high resistivity region and a current aperture enclosed by the high resistivity region, wherein the high resistivity region comprises more metal oxides than the current aperture so as to achieve a resistivity higher than that of the current aperture;
   a third nitride-based semiconductor layer disposed over the second nitride-based semiconductor layer;
   a first source electrode and a second source electrode disposed over the third nitride-based semiconductor layer; and
   a gate electrode disposed over the third nitride-based semiconductor layer and between the first source electrode and the second source electrode, wherein the gate electrode aligns with the current aperture.

2. The semiconductor device of claim 1, wherein the single III-V group semiconductor layer has a group III element in the current aperture.

3. The semiconductor device of claim 2, wherein the single III-V group semiconductor layer has a concentration of the group III element changes along a vertical direction.

4. The semiconductor device of claim 3, wherein the concentration of the group III element increases along the vertical direction from the first nitride-based semiconductor layer to the second nitride-based semiconductor layer.

5. The semiconductor device of claim 3, wherein the concentration of the group III element decreases along the vertical direction from the first nitride-based semiconductor layer to the second nitride-based semiconductor layer.

6. The semiconductor device of claim 1, wherein the current aperture has a width decreasing along a vertical direction from the first nitride-based semiconductor layer to the second nitride-based semiconductor layer.

7. The semiconductor device of claim 1, wherein the current aperture has a width increasing along a vertical direction from the first nitride-based semiconductor layer to the second nitride-based semiconductor layer.

8. The semiconductor device of claim 1, wherein the current aperture has a width decreasing and then increasing along a vertical direction from the first nitride-based semiconductor layer to the second nitride-based semiconductor layer.

9. The semiconductor device of claim 1, further comprising:
   a fourth nitride-based semiconductor layer doped to a second conductivity type and disposed between the third nitride-based semiconductor layer and the gate electrode, wherein the fourth nitride-based semiconductor layer has a width greater than that of the current aperture.

10. The semiconductor device of claim 1, wherein the single III-V group semiconductor layer comprises III-V ternary compound.

11. The semiconductor device of claim 10, wherein the single III-V group semiconductor layer comprises InAlN.

12. The semiconductor device of claim 1, wherein the single III-V group semiconductor layer is in contact with the first and second nitride-based semiconductor layers.

13. The semiconductor device of claim 12, wherein the first and second nitride-based semiconductor layers are devoid of aluminum.

14. The semiconductor device of claim 1, further comprising:
   a drain electrode electrically coupled with the current aperture, wherein the first nitride-based semiconductor layer is located between the drain electrode and the second nitride-based semiconductor layer.

15. The semiconductor device of claim 14, wherein the drain electrode is directly connected to the first nitride-based semiconductor layer.

* * * * *